United States Patent
Hsieh

(10) Patent No.: US 8,431,487 B2
(45) Date of Patent: Apr. 30, 2013

(54) METHOD FOR FORMING A PLUG STRUCTURE

(75) Inventor: Chao-Ching Hsieh, Tai-Nan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 40 days.

(21) Appl. No.: 13/006,358

(22) Filed: Jan. 13, 2011

(65) Prior Publication Data

US 2011/0104895 A1 May 5, 2011

Related U.S. Application Data

(62) Division of application No. 11/874,186, filed on Oct. 17, 2007, now abandoned.

(51) Int. Cl.
*H01L 21/44* (2006.01)
*H01L 21/4763* (2006.01)

(52) U.S. Cl.
USPC .............. 438/675; 438/637; 438/639

(58) Field of Classification Search .......... 438/637, 438/639, 640, 672, 675; 257/E21.649
See application file for complete search history.

(56) References Cited

U.S. PATENT DOCUMENTS

| 5,994,211 | A | 11/1999 | Wang | |
|---|---|---|---|---|
| 6,048,788 | A | 4/2000 | Huang | |
| 6,204,550 | B1 * | 3/2001 | Wang et al. | 257/622 |
| 6,228,209 | B1 | 5/2001 | Chen | |
| 6,812,140 | B2 * | 11/2004 | Chang et al. | 438/637 |
| 6,953,742 | B2 | 10/2005 | Chen | |
| 6,974,768 | B1 | 12/2005 | Kailasam | |
| 2005/0118796 | A1 | 6/2005 | Chiras | |
| 2005/0181598 | A1 * | 8/2005 | Kailasam | 438/654 |
| 2006/0043429 | A1 * | 3/2006 | Huglin et al. | 257/213 |
| 2007/0161218 | A1 * | 7/2007 | Ichinose et al. | 438/519 |

* cited by examiner

*Primary Examiner* — Hung Vu

(74) *Attorney, Agent, or Firm* — Winston Hsu; Scott Margo

(57) ABSTRACT

A method for forming a plug structure includes the following steps. A substrate is provided. The substrate includes a MOS device with a source/drain region, a dielectric layer disposed on the MOS device, an opening defined in the dielectric layer, and a first glue layer disposed on a sidewall and a bottom of the opening. A portion of the first glue layer disposed at the bottom of the opening is punched through to expose the source/drain region. A barrier layer is formed over the substrate after the first glue layer is punched through. The opening is filled with a conductive structure, wherein the barrier layer disposed at the bottom of the opening is remained when the conductive structure is filled into the opening.

8 Claims, 23 Drawing Sheets

METHOD FOR FORMING A PLUG STRUCTURE

CROSS REFERENCE TO RELATED APPLICATIONS

This application is a division of application Ser. No. 11/874,186 filed on Oct. 17, 2007.

BACKGROUND OF THE INVENTION

1. Field of the Invention

The present invention relates to a method for forming a plug structure, and more particularly to a method of cleaning an opening by using a punching through process.

2. Description of the Prior Art

Currently, semiconductor devices are widely involved in many products and services in our daily life. These semiconductor devices are fabricated through many processes, such as photolithography, deposition, ion implantation, or etching, to form a plurality of integrated circuit (IC) devices on a wafer. In semiconductor fabrication on a wafer, an opening with a high aspect ratio, which is defined as a ratio of the depth to the width, is needed in some situations. The opening, such as a via hole or a contact hole, is formed in a dielectric layer and is filled with a metallic material, such as tungsten, to form a plug.

Please refer to FIGS. 1-3. FIGS. 1-3 are schematic cross-sectional diagrams illustrating a method for forming a contact plug in a wafer 10 according to the prior art. As shown in FIG. 1, a wafer 10 is provided first. The wafer 10 includes a substrate 12, a plurality of metal-oxide-semiconductor (MOS) devices 14 formed on the substrate 12, a dielectric layer 16 covering the substrate 12, and a plurality of plug holes 18 formed in the dielectric layer 16. There are usually some unwanted oxides 50, such as native oxides, formed on the surface of the MOS devices 14. These oxides 50 will interfere the electrical connection between the MOS devices 14 and the subsequently formed contact plug.

As shown in FIG. 2, in order to remove the oxides 50, an argon (Ar) cleaning process is subsequently carried out before a glue layer is formed. As the industry progresses into submicron processing techniques, a higher aspect ratio is needed for the contact plug, and it is therefore harder to completely remove all the oxides 50. As a result, the argon cleaning process should be enhanced, or the process time of the argon cleaning process should be extended to clean the bottom oxides 50. However, when the argon cleaning process is enhanced, or the process time of the argon cleaning process is extended, a portion of the dielectric layer 16 positioned around the top corner of the plug hole 18 might be over-rounded. More the argon cleaning process is performed, more seriously the top corner of the plug hole 18 is over-rounded.

As shown in FIG. 3, a titanium layer 22 is afterward formed over the dielectric layer 16 by a physical vapor deposition (PVD) process, a titanium nitride layer 24 is next formed over the titanium layer 22 by a chemical vapor deposition (CVD) process, and a tungsten layer 26 is formed over the wafer 10 to fill the plug hole 18. Thereafter, a chemical mechanical polishing (CMP) process is performed to remove excessive parts of the tungsten layer 26, excessive parts of the titanium nitride layer 24, and excessive parts of the titanium layer 22, so as to form contact plugs 28 in the dielectric layer 16. The titanium layer 22 or the titanium nitride layer 24 functions as a glue layer or a barrier layer around the contact plugs 28.

Because the top corner of the plug hole 18 is over-rounded, a barrier bridge problem 30 is caused between contact plugs 28, as shown in FIG. 3, especially when the critical dimension (CD) becomes smaller. The titanium layer 22 or the titanium nitride layer 24 electrically connects two independent contact plugs 28 with each other, and causes a short circuit in the wafer 10. Therefore, the fabricated products fail in performance.

In order to prevent the barrier bridge problem 30 and remove the oxides 50, an F-base cleaning process is carried out instead of the argon cleaning process, as shown in FIG. 4. However, the F-base selectivity with $SiO_2$ and SiN is poor, so it is easy to cause the CD of the contact plug 28 to be enlarged, especially at the SiN spacer or a SiN contact etch stop layer (CESL). It is easy to widen the contact plug 28 to reach the poly-gate of the MOS device 14, and causes a short circuit between the contact plug 28 and the poly-gate.

The existence of oxides reduces the device performance, and the short circuit even causes a failure of the device. Accordingly, it is desired to provide a cleaning method that does not deform the opening.

SUMMARY OF THE INVENTION

It is therefore an objective of the present invention to provide a method for cleaning an opening and the related plug structure so that the formed product has a great performance.

It is an objective of the present invention to provide a method for forming a plug structure. The method for forming the plug structure includes the following steps. A substrate is provided. The substrate includes a MOS device with a source/drain region, a dielectric layer disposed on the MOS device, an opening defined in the dielectric layer, and a first glue layer disposed on a sidewall and a bottom of the opening. A portion of the first glue layer disposed at the bottom of the opening is punched through to expose the source/drain region. A barrier layer is formed over the substrate after the first glue layer is punched through. The opening is filled with a conductive structure, wherein the barrier layer disposed at the bottom of the opening is remained when the conductive structure is filled into the opening.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The method is suitable for cleaning any kind of opening in a semiconductor wafer, such as a via hole, a contact hole, a trench, or a damascene opening.

Figure 1:
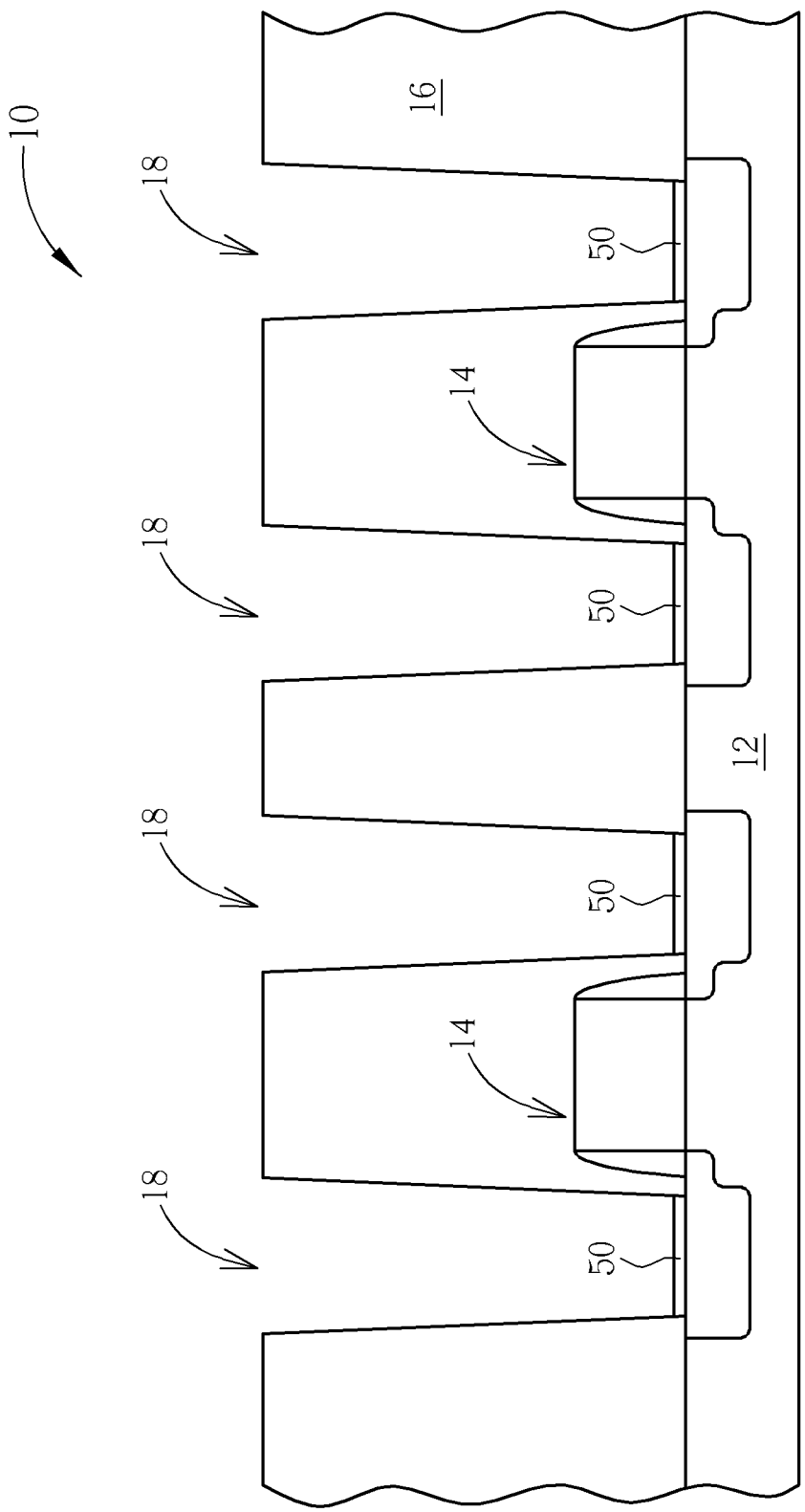
FIGS. 1-3 are schematic cross-sectional diagrams illustrating a method for forming a contact plug in a wafer according to the prior art.
Figure 2:
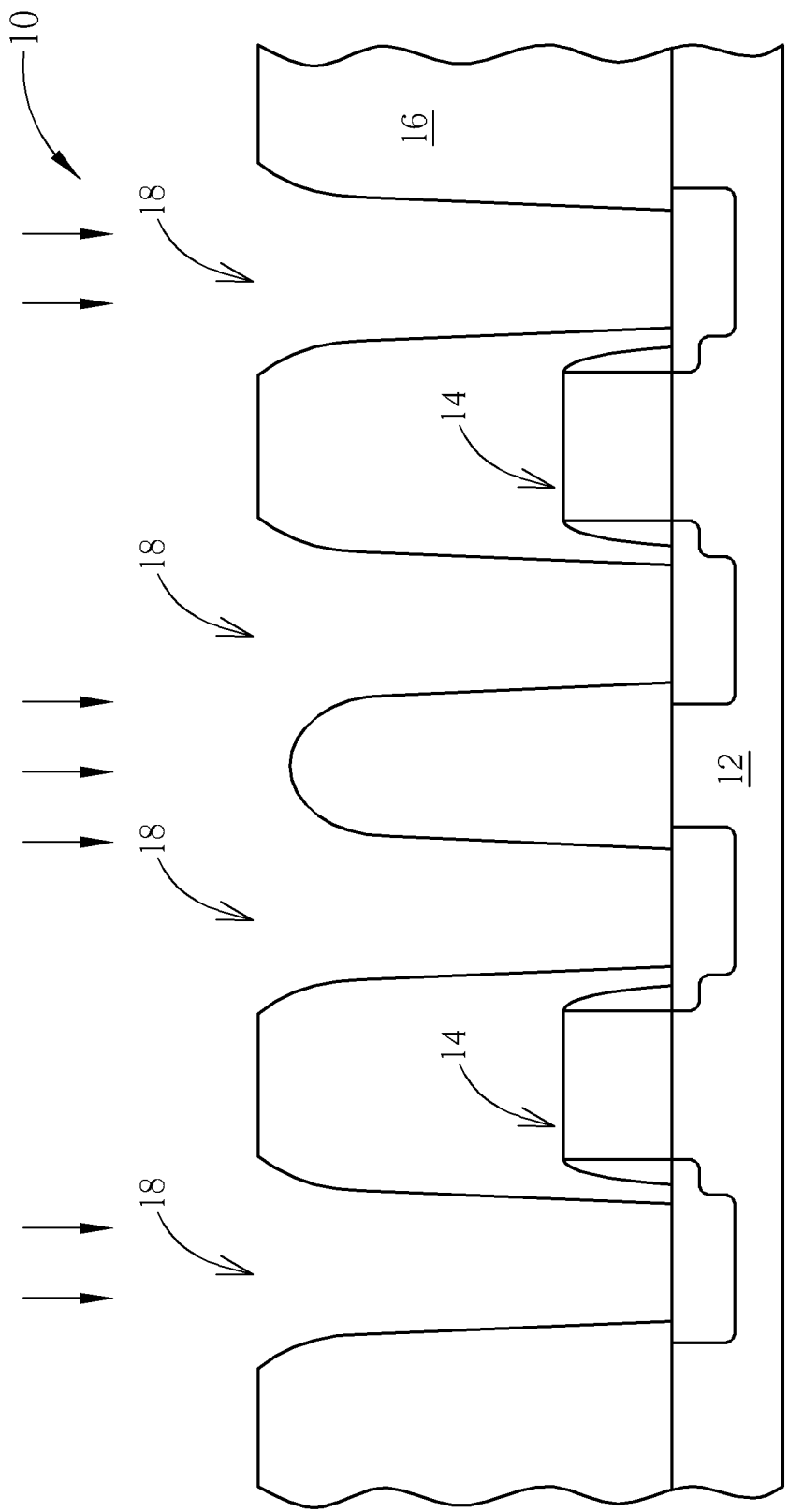
Figure 3:
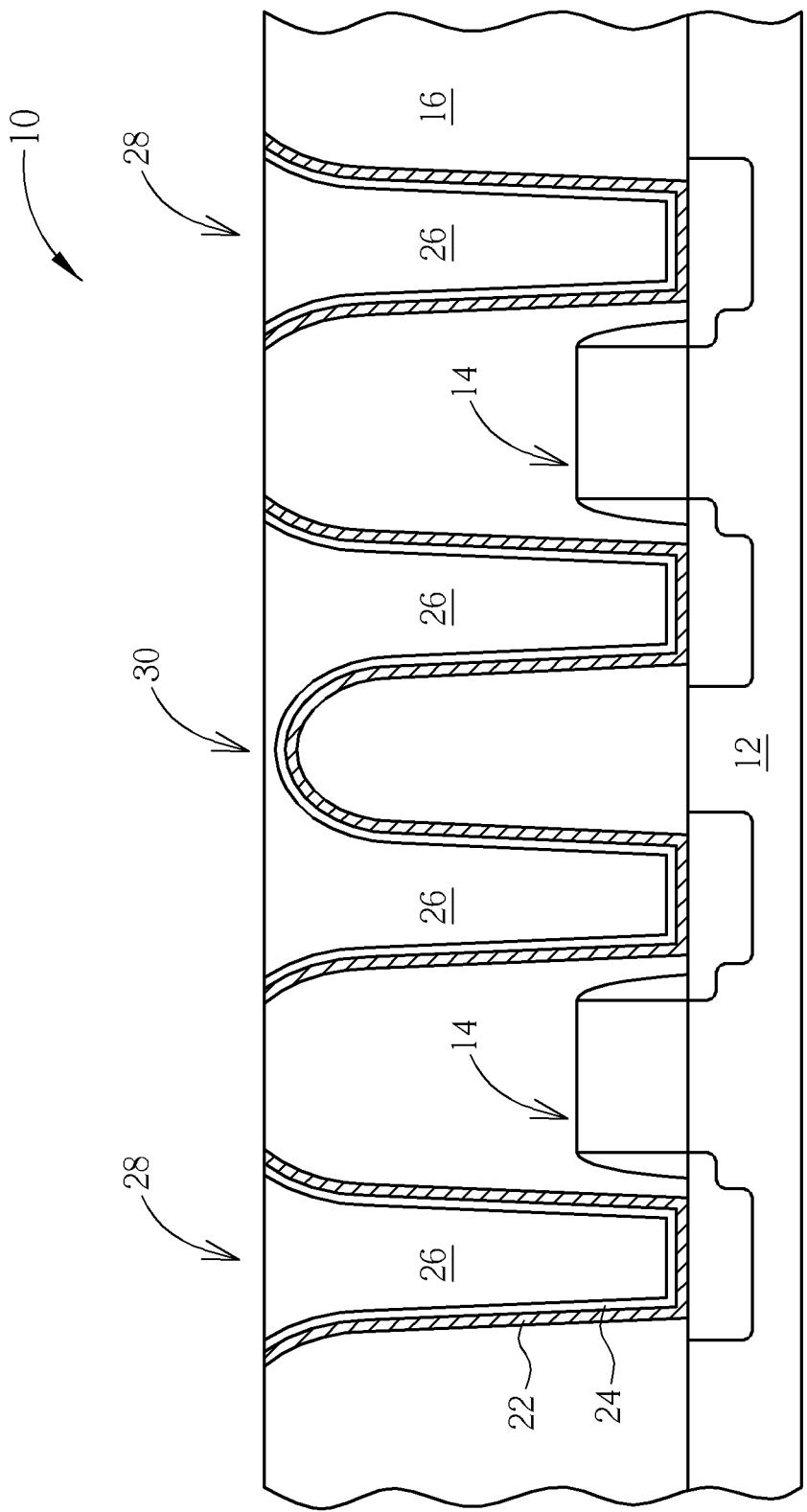
Figure 4:
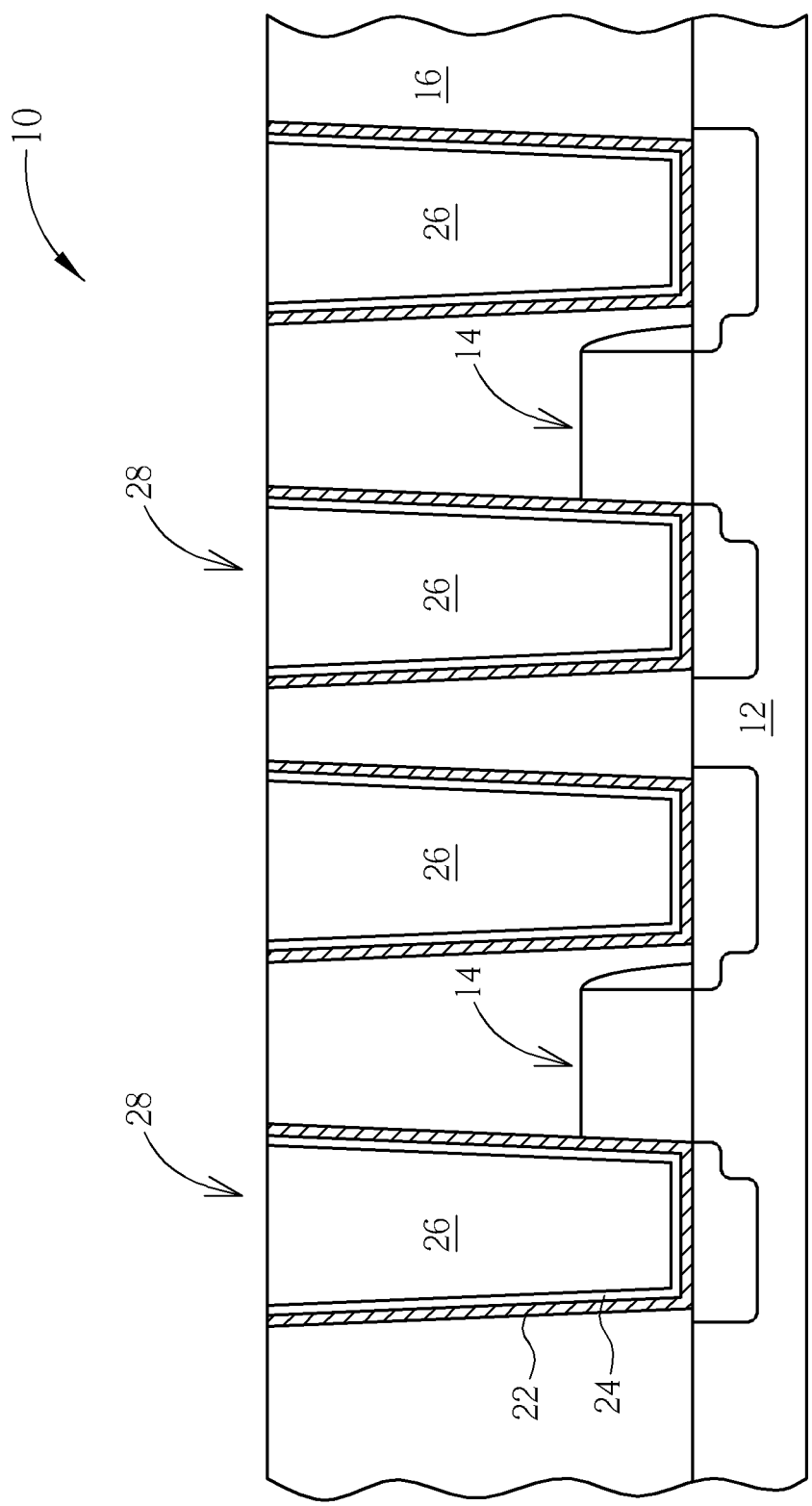
FIG. 4 is a schematic cross-sectional diagram illustrating another method for forming a contact plug in a wafer according to the prior art.
Figure 5:
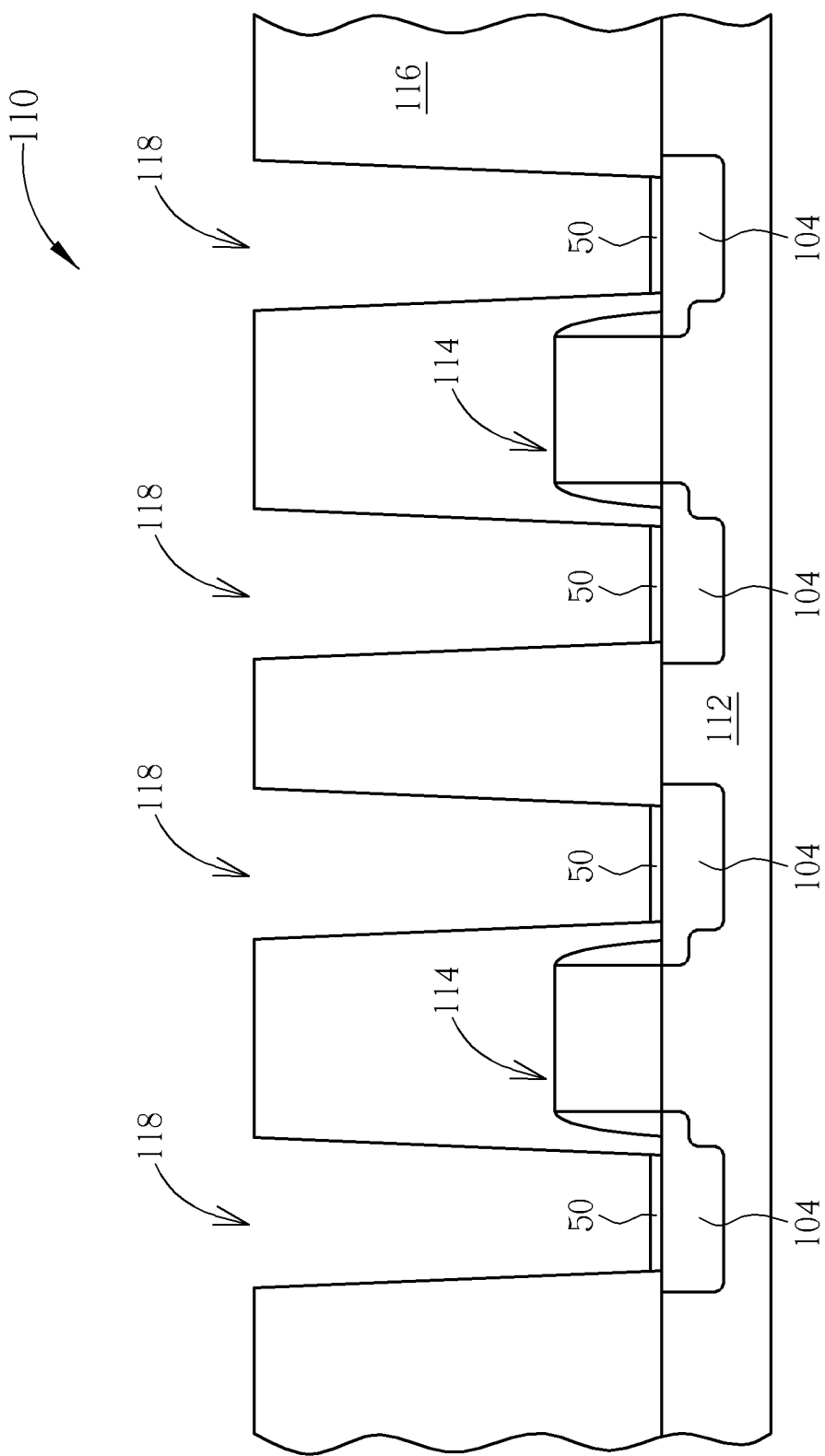
FIGS. 5-9 are schematic cross-sectional diagrams illustrating a method for forming a plug structure according to a first preferred embodiment of the invention.

Please refer to FIGS. 5-9. FIGS. 5-9 are schematic cross-sectional diagrams illustrating a method for forming a plug structure according to a first preferred embodiment of the invention, where like number numerals designate similar or the same parts, regions or elements. It is to be understood that the drawings are not drawn to scale and are served only for illustration purposes. It is to be understood that some details about etch stop layers, horizontal interconnects, advanced structures, such as dual damascene structures, lithographic and etching processes relating to the present invention method are known in the art and thus not explicitly shown in the drawings. As shown in FIG. 5, a wafer 110 is provided first. The wafer 110 comprises a substrate 112, a MOS device 114 formed on the substrate 112, and a dielectric layer 116 covering the substrate 112. An opening 118 exposing one corresponding conducting region 104 of the MOS device 114 can be formed in the dielectric layer 116 by, for example, photolithography and etching. The opening 118 can be a high aspect ratio opening, and the width of the opening 118 is relative small to the depth. For example, the opening 118 is a contact hole in this embodiment.

There are usually some unwanted oxides 50, such as native oxides, formed on the surface of the MOS device 114. For instance, the oxides 50 might be formed on the conducting regions 104 of the MOS device 114. These oxides 50 may degrade the electrical connection between the MOS device 114 and the subsequently formed contact plug in the opening 118. In addition, residues (not shown in the drawing) might also formed at the bottom of the opening 118 during an etching process of forming the opening 118, where the residues usually contains high-molecule polymers with carbon, silicon, nitrogen, fluorine, titanium, or other impurities.

The wafer 110 can also be taken as a semiconductor substrate, and can further include more devices or components (not shown in the drawing) therein. The substrate 112 can be made from semiconductor materials, such as a silicon substrate, a silicon-containing substrate, or a silicon-on-insulator (SOI). The conducting regions 104 of the MOS device 114 can contain salicide, such as nickel silicide (NiSi), for reducing the contact resistance between the MOS device 114 and the following-formed plugs. It should be noted that the MOS device 114 could be replaced with any component or device, such as a diode, a capacitor, a resistor, or even a metallic structure, that should be electrically connected to a plug or to a trench. The dielectric layer 116 is usually sandwiched between one metal layer on the top and the substrate 112 at the bottom, or between two metal layers. The dielectric layer 116 can contain lower dielectric constant (low-k) materials, such as a silicon-containing layer including fluorinated silicate glass (FSG) or a carbon-containing layer including carbon-doped oxide (CDO). In other embodiment, the dielectric layer 116 can be replaced by other material layers.

Figure 6:
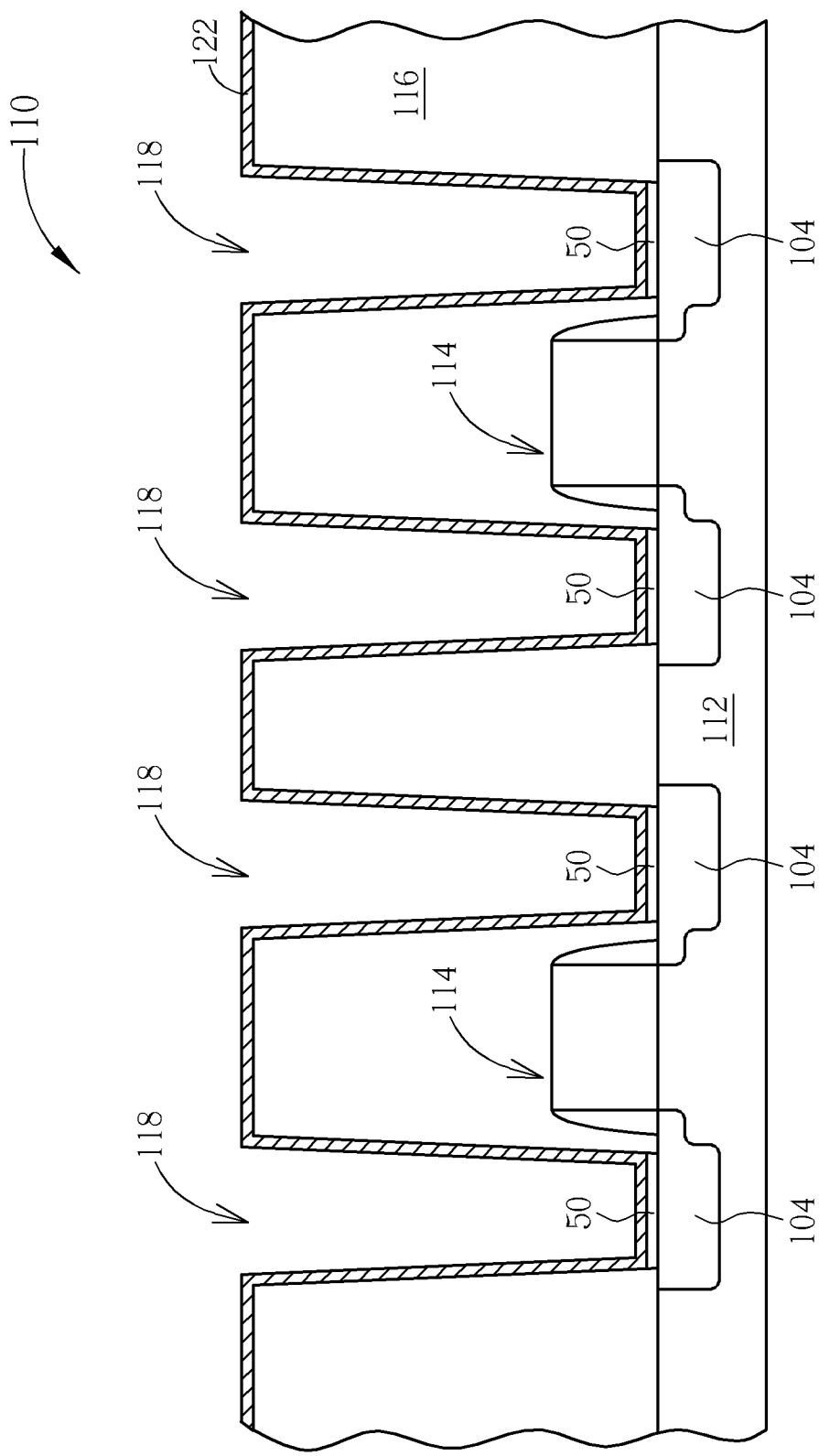

As shown in FIG. 6, a glue layer 122 is substantially formed over wafer 110, and a portion of the glue layer 122 can be disposed at the bottom and sidewall of the opening 118. The glue layer 122 can be applied to protect the structure of the opening 118, and to improve the adhesion between the dielectric layer 116 and the subsequently formed metal plug. Accordingly, the glue layer 122 can include metal materials, such as titanium, tantalum, or tungsten. For example, the glue layer 122 includes a titanium layer formed by a physical vapor deposition process in this embodiment.

Figure 7:
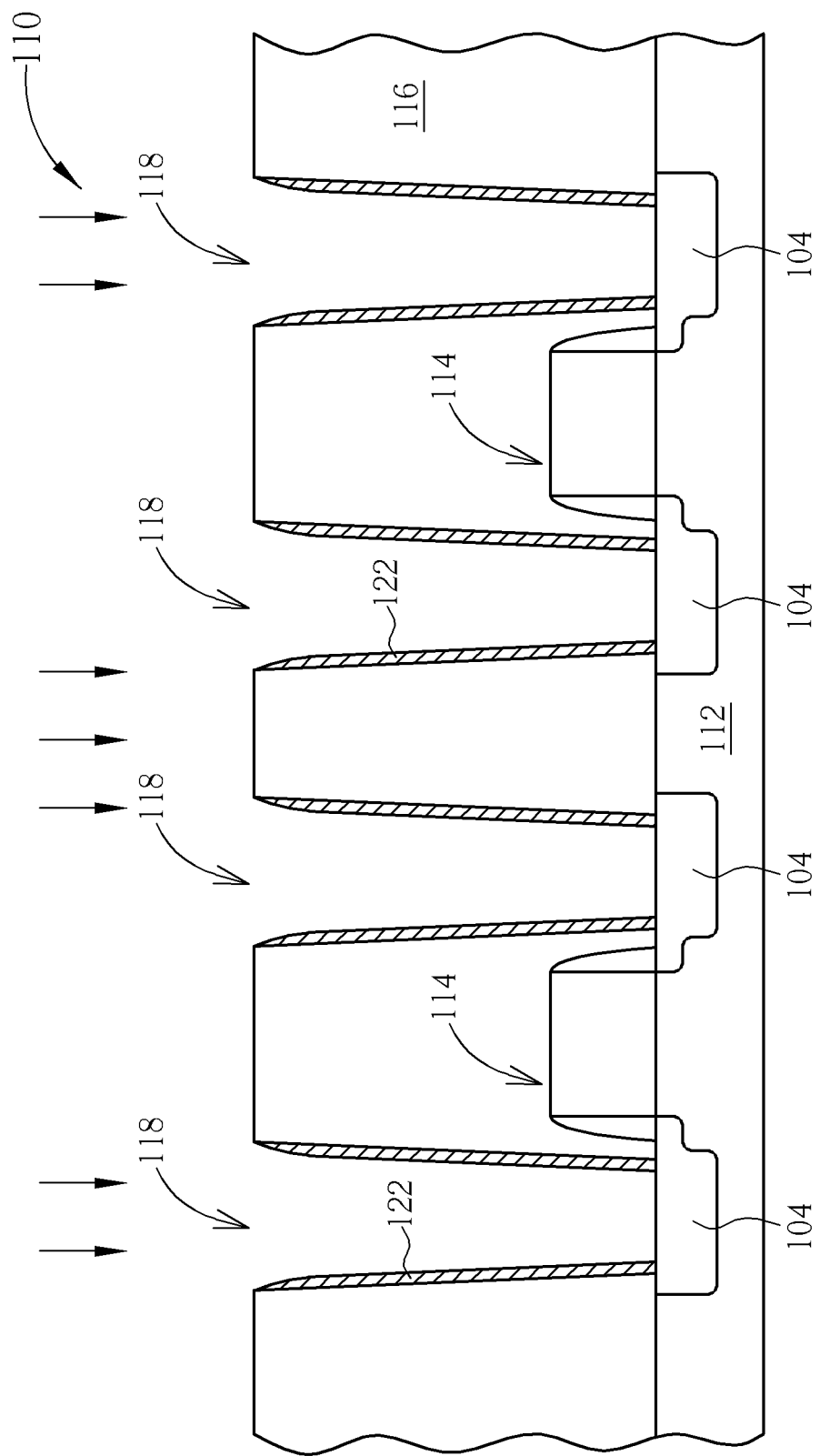

As shown in FIG. 7, a punching through process is performed. The portion of the glue layer 122 disposed at the bottoms of the openings 118 is punched through until the MOS device 114 is exposed so as to remove the unwanted oxide 50. The portion of the glue layer 122 disposed at the bottoms of the openings 118 can be punched through by using an anisotropic etching process, such as a radio-frequency (RF) sputtering process. The RF sputtering process includes a gas or metal, such as nitrogen gas, flushed into a reaction chamber, and a RF power source used to ionize the gas into ions. The wafer 110 is applied with a voltage to produce electric field, which energizes ions by accelerating ions in order to bombard the wafer 110. Accordingly, the unwanted oxide 50 and the portion of the glue layer 122 disposed at the bottom of the opening 118 are removed.

An opening having overhang structure may degrade the step coverage performance for the subsequent process for a formation of a plug. If the opening 118 has an overhang structure on each upper corner of the opening 118, the overhang structure can also be removed by utilizing the above-mentioned punching through process. The avoidance of the overhang structure of the glue layer on the upper corners of the opening can improve the step coverage performance.

It deserves to be mentioned that other portions of the glue layer 122 disposed on the surface of the dielectric layer 116 might also be removed in the above-mentioned punching through process. For example, the top surface of the dielectric layer 116 outside the opening 118 might be exposed in this embodiment after the punching through process. In other embodiments, portions of the glue layer 122 disposed on the sidewalls of the openings 118 might be removed, or portions of the glue layer 122 disposed on the top surface of the dielectric layer 116 might not be removed. The removed portions and the remained portions of the glue layer 122 can be modified by adjusting parameters of the punching through process or by a patterned hard mask.

Figure 8:
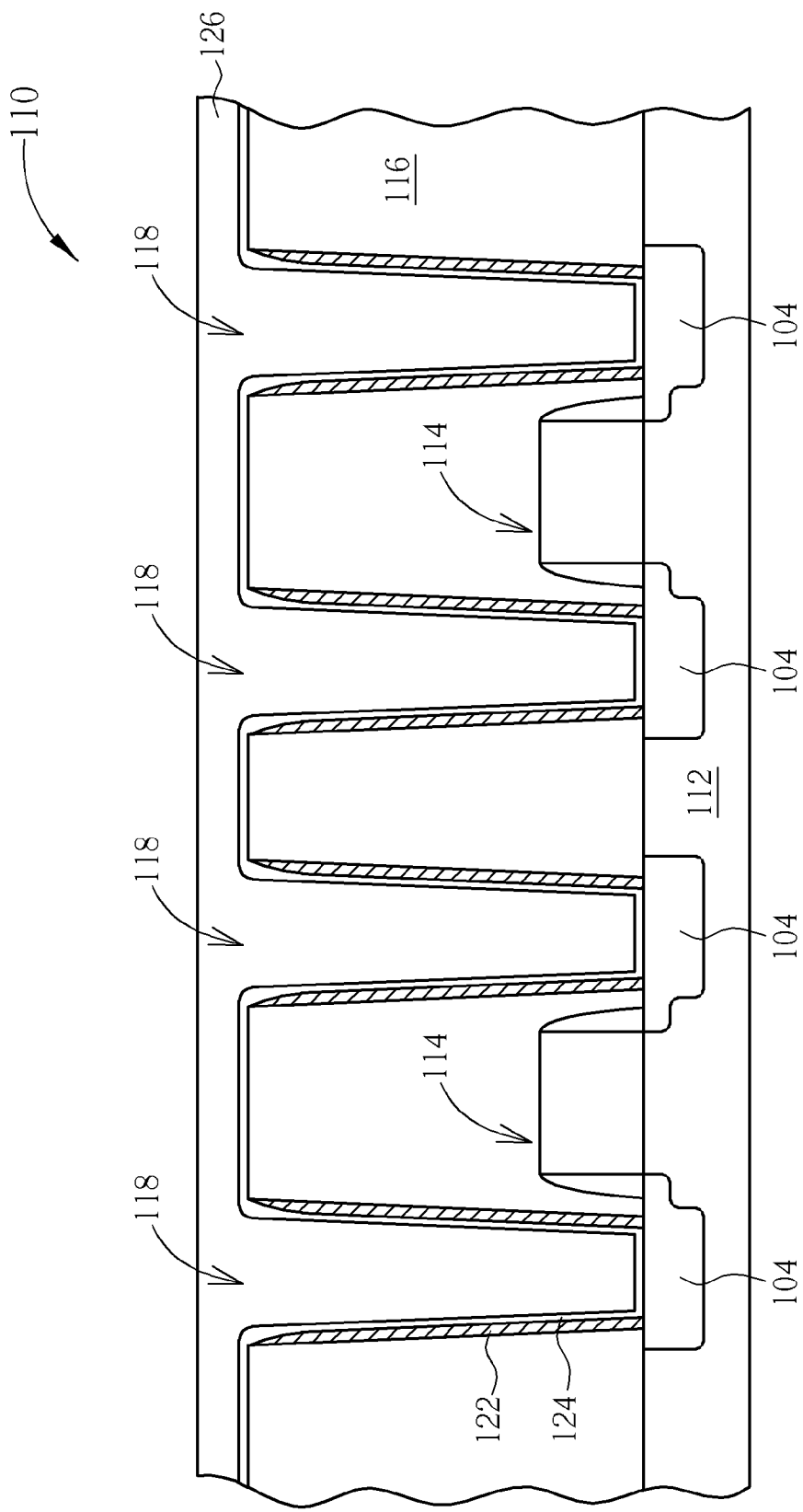

As shown in FIG. 8, a barrier layer 124 is next formed over the wafer 110, and a conductive material 126 is thereafter formed to fill the opening 118. The barrier layer 124 can cover the bottom of the opening 118 and the surface of the glue layer 122. The barrier layer 124 can be applied to improve the ohmic contact between the conducting regions 104 of the MOS device 114 and the conductive material 126. Accordingly, the barrier layer 124 can include refractory or noble metal or compound, such as titanium nitride, tantalum nitride, tungsten nitride, or their combination. For example, the barrier layer 124 can include a titanium nitride layer formed by a chemical vapor deposition (CVD) process in this embodiment. The conductive material 126 can be any material having a high conductivity, such as tungsten, copper, aluminum, other metals or their alloy. For instance, the conductive material 126 can include tungsten formed by a deposition process in this embodiment.

Figure 9:
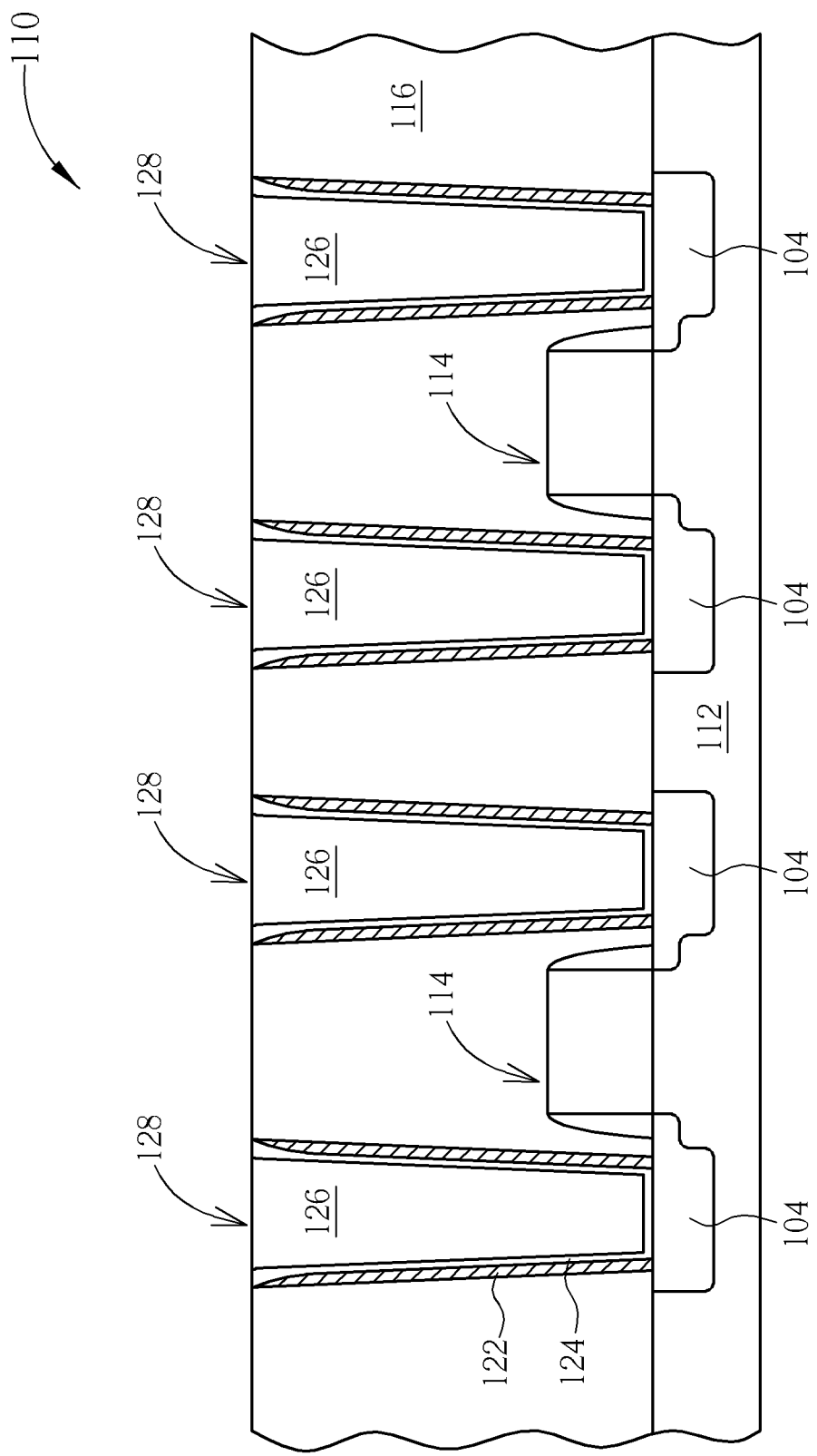

Afterward, as shown in FIG. 9, a planarization process, such as a chemical mechanical polishing process, is performed to remove excessive portions of the conductive material 126, and excessive portions of the barrier layer 124, so as to form a plurality of plug structures 128 in the dielectric layer 116. The remained conductive material 126 therefore becomes a conductive structure. A plug structure is usually applied to interconnect two conductive components for an interconnection between devices. In this embodiment, the plug structures 128 function as contact plugs to electrically connect the lower MOS devices 114 with the upper metal layer or with other devices. In practice, the punching through process can be applied to any fabrication, in which an opening should be cleaned. For example, the present invention can be applied to a fabrication of a via plug, a fabrication of a contact plug, a fabrication of a damascene structure, or even a fabrication of a shallow trench isolation.

Figure 10:
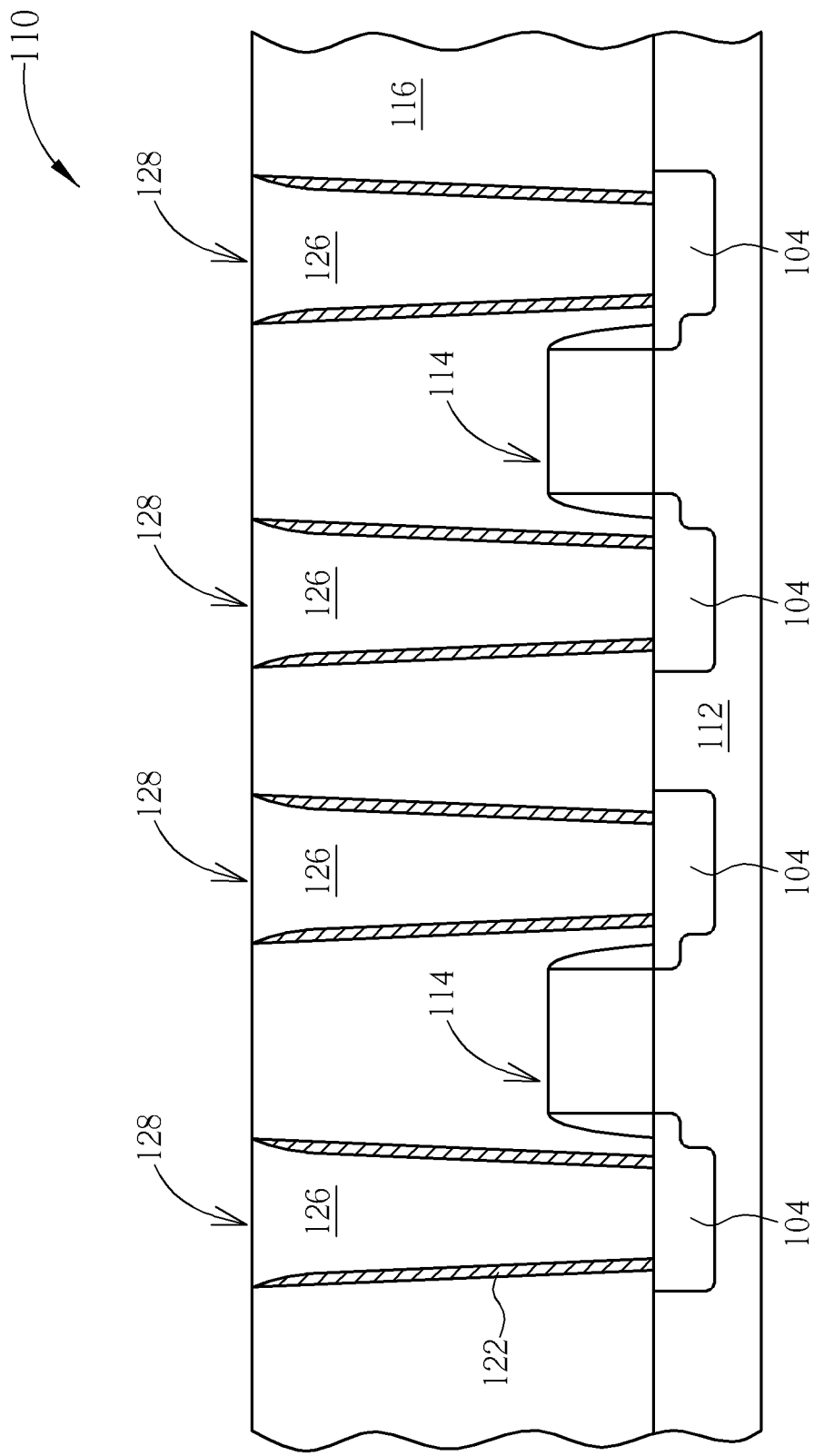
FIG. 10 is a schematic cross-sectional diagram illustrating a method for forming a plug structure according to a second preferred embodiment of the invention.

It is worthy of note that the fabrication of the barrier layer 124 can be eliminated in some embodiments. Please refer to FIG. 10, which is a schematic cross-sectional diagram illustrating a method for forming a plug structure according to a second preferred embodiment of the invention. As shown in FIG. 10, the fabrication of the barrier layer 124 can be eliminated if the conductive material 126 is formed by a chemical vapor deposition process, where tungsten hexafluoride ($WF_6$), tungsten chloride ($WCl_6$) or tungsten trioxide ($WO_3$) is utilized as the tungsten source. In addition, if the conductive material 126 is formed in a co-reactant system, where organometallic precursors, such as tungsten hexacarbonyl ($W(CO)_6$), is employed, or the conductive material 126 is formed by a metal organic chemical vapor deposition (MOCVD) process, where $Cl_4(CH_3CN)W(NPr)$ is utilized as precursor, the fabrication of the barrier layer 124 can be eliminated.

In other embodiments, another glue layer can be formed over the wafer 110 after the glue layer 122 is punched through. Please refer to FIGS. 11-12, which are schematic cross-sectional diagrams illustrating a method for forming a plug structure according to a third preferred embodiment of the invention, where like number numerals designate similar or the same parts, regions or elements. In this embodiment, a wafer 110 having a structure similar to the wafer 110 shown in FIG. 5 can be first provided. Subsequently, a glue layer 122 can be formed over the wafer 110, and a punching through process can be performed to remove the portion of glue layer 122 and the oxide 50 positioned at the bottom of the opening 118 according to the steps shown in FIG. 6 and FIG. 7.

Figure 11:
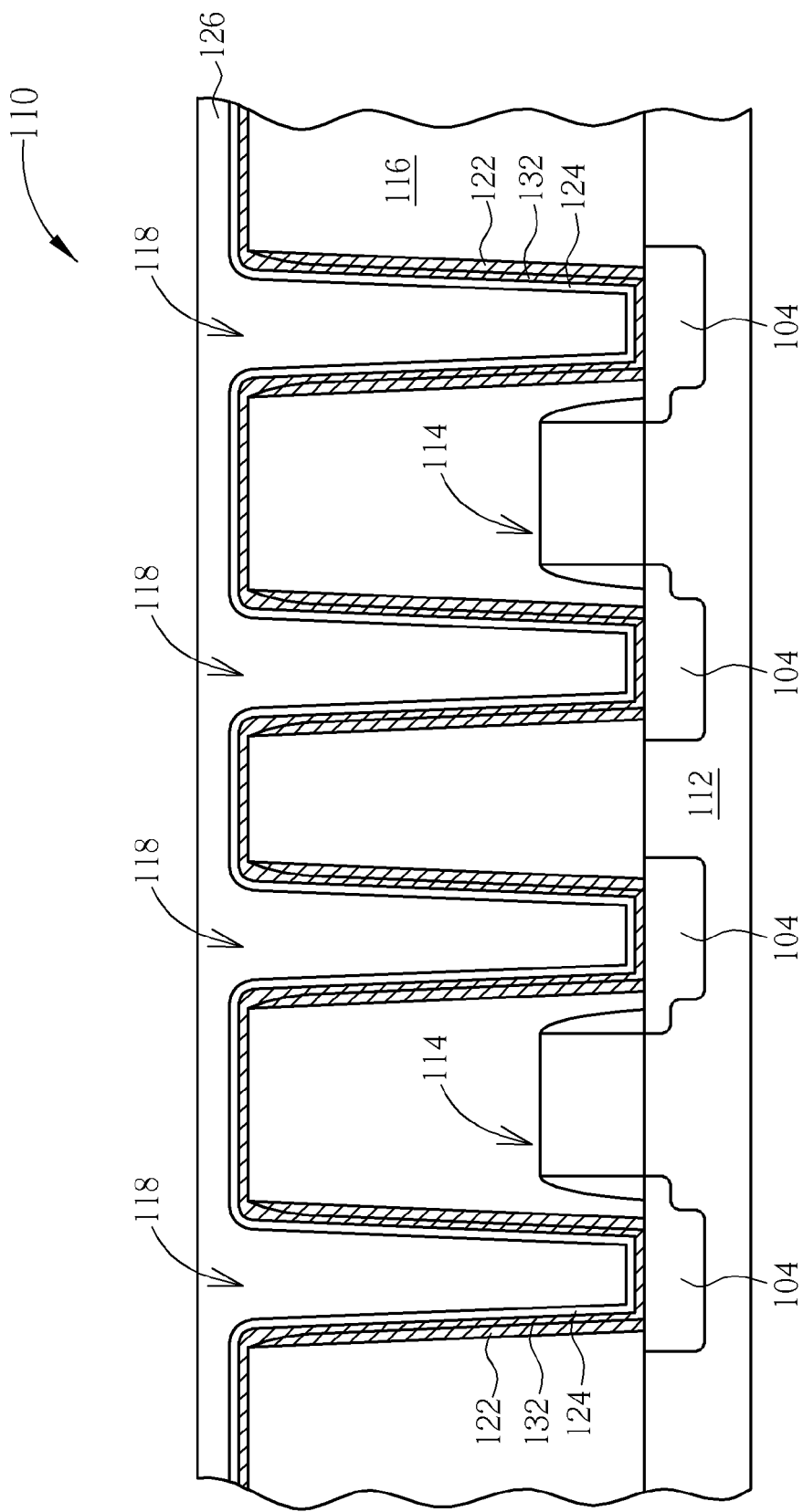
FIGS. 11-12 are schematic cross-sectional diagrams illustrating a method for forming a plug structure according to a third preferred embodiment of the invention.

Thereafter, as shown in FIG. 11, another glue layer 132 can be formed over the wafer 110, a barrier layer 124 is next formed on the glue layer 132, and a conductive material 126 is next formed to fill the opening 118. A portion of the glue layer 132 is disposed at the bottom of the opening 118, and covers the surface of the glue layer 122. The glue layer 132 can include metal materials, such as titanium, tantalum, or tungsten. For example, the glue layer 132 can include a titanium layer formed by a physical vapor deposition process.

Figure 12:
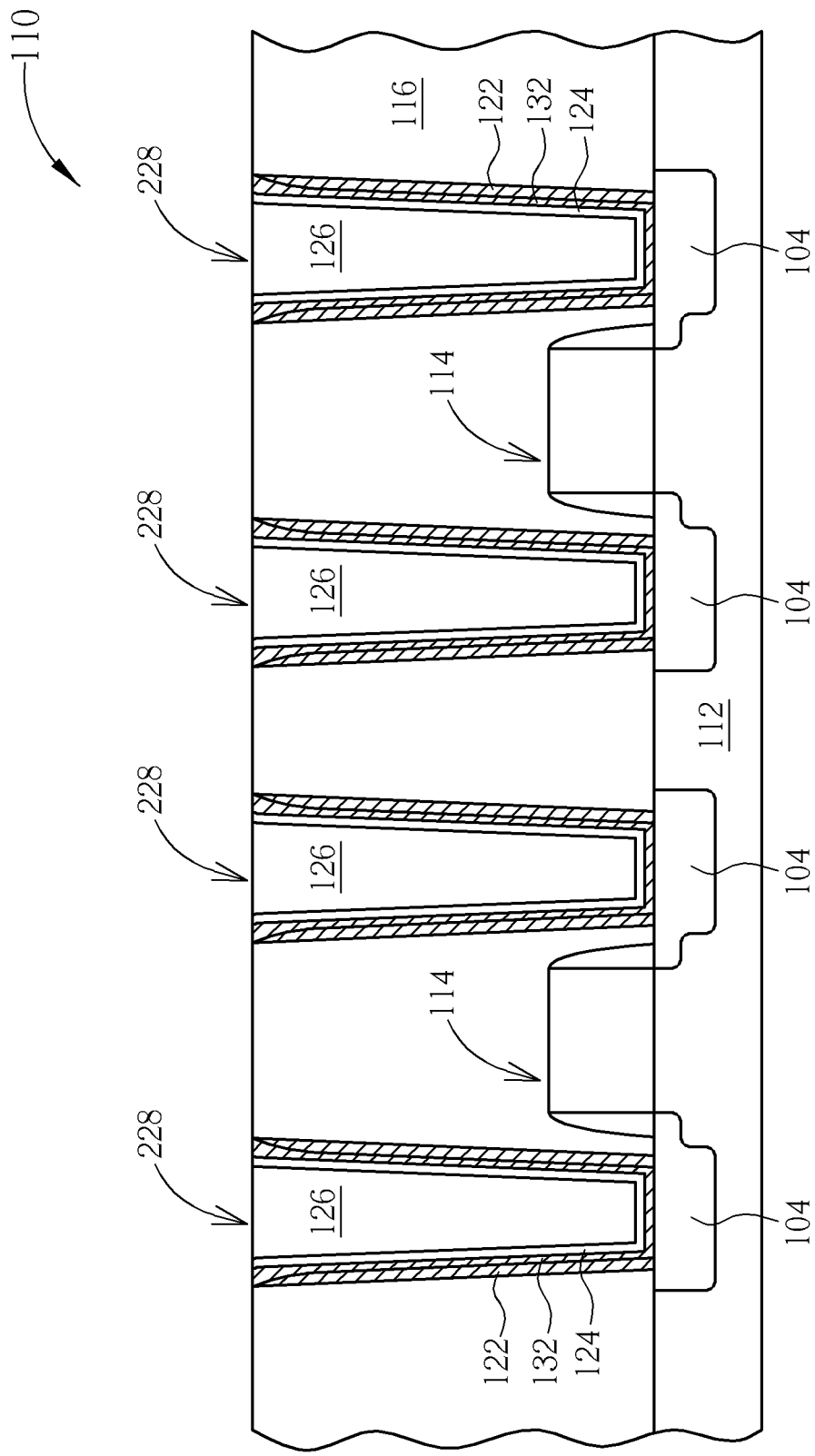

Afterward, as shown in FIG. 12, a planarization process is performed to remove excessive portions of the conductive material 126, excessive portions of the barrier layer 124, and excessive portions of the glue layer 132, so as to form a plurality of plug structures 228 in the dielectric layer 116. In this embodiment, the glue layer 132 can be applied for improving the adhesion between the MOS devices 114 and the subsequently formed metal plug.

Figure 13:
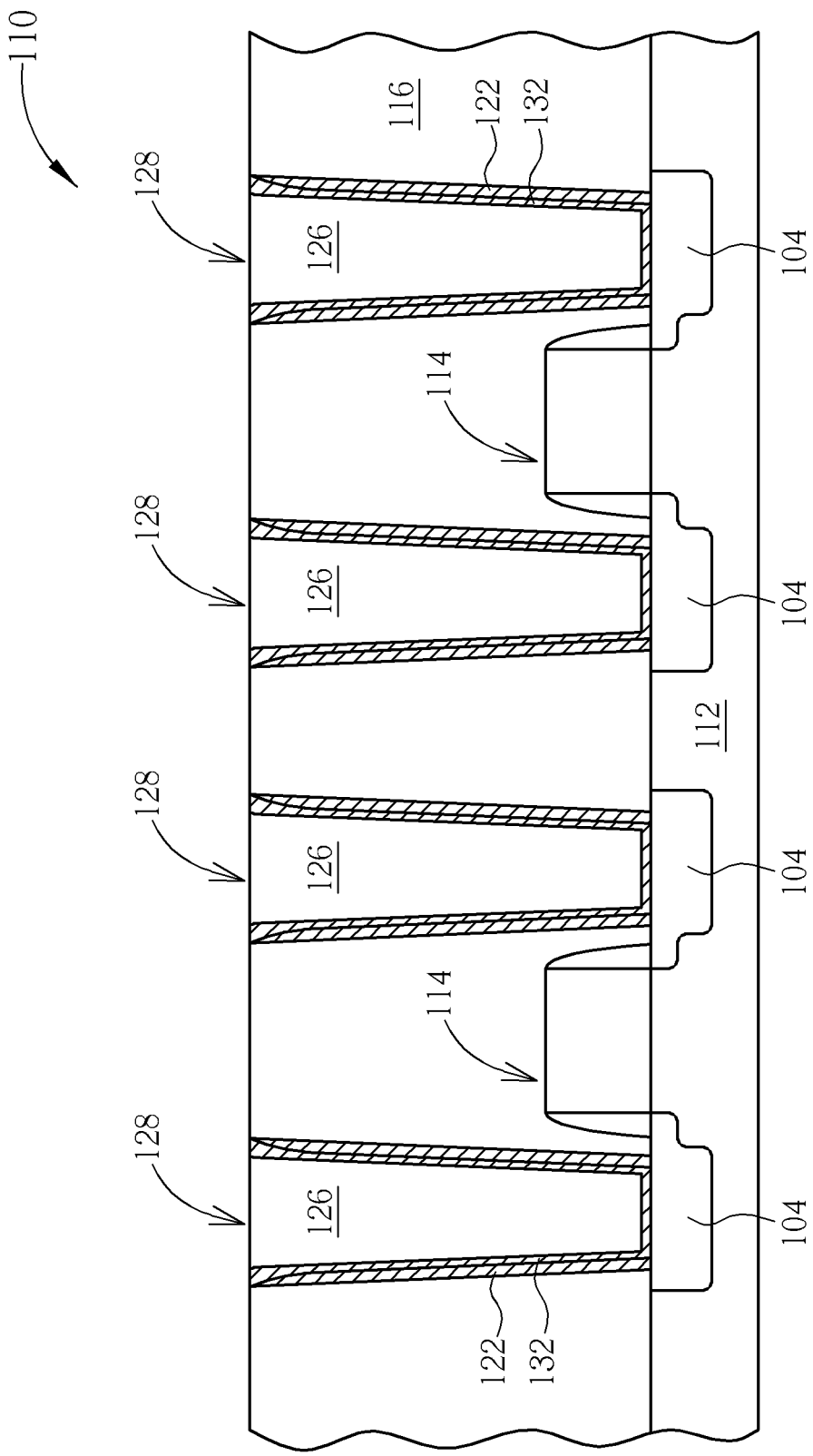
FIG. 13 is a schematic cross-sectional diagram illustrating a method for forming a plug structure according to a fourth preferred embodiment of the invention.

The fabrication of the barrier layer 124 shown in FIG. 12 can also be eliminated. Please refer to FIG. 13, which is a schematic cross-sectional diagram illustrating a method for forming a plug structure according to a fourth preferred embodiment of the invention. As shown in FIG. 13, the fabrication of the barrier layer 124 can be eliminated, so the conductive material 126 covers the surface of the glue layer 132 and contacts the MOS devices 114.

Figure 14:
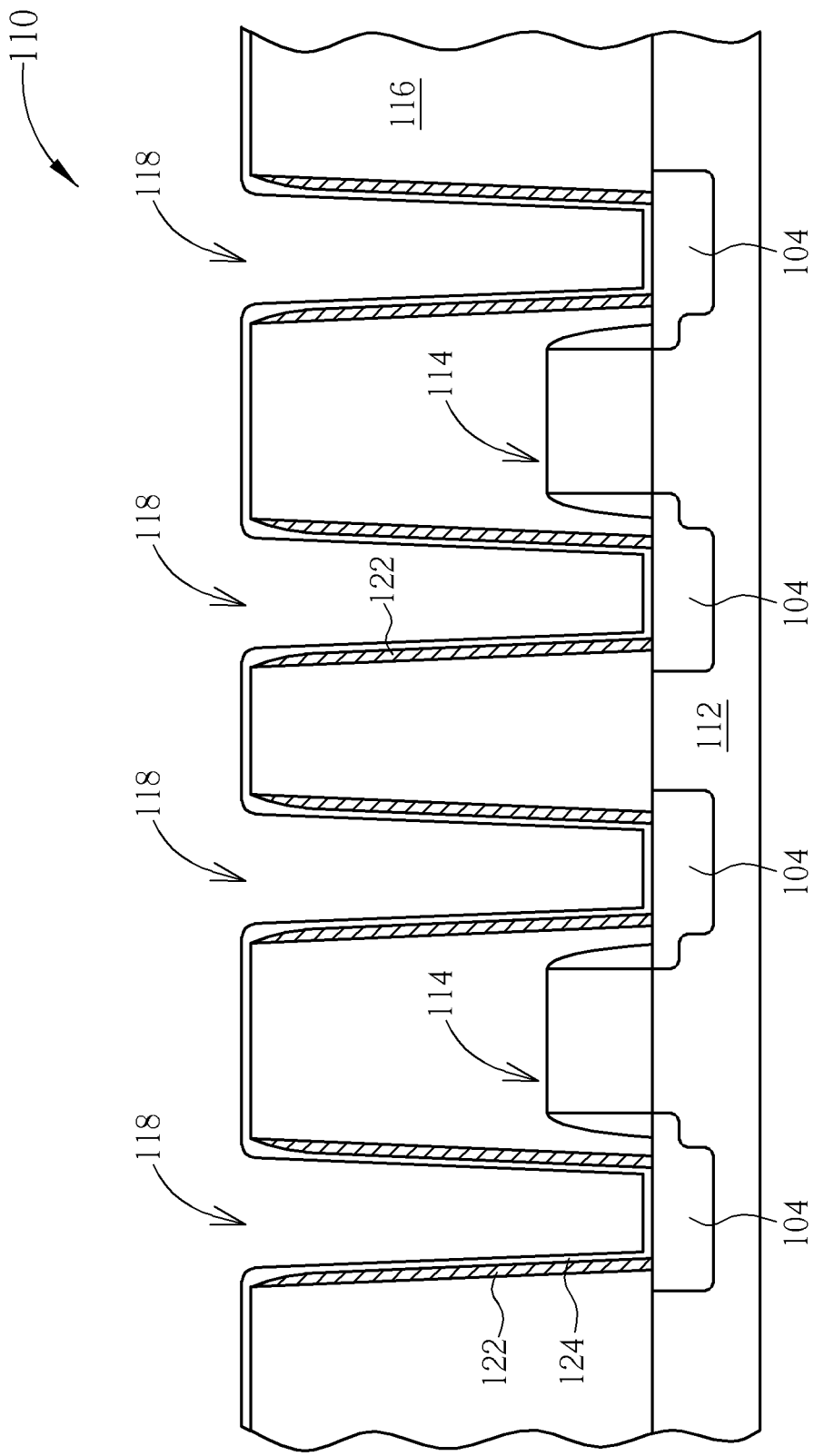
FIGS. 14-17 are schematic cross-sectional diagrams illustrating a method for forming a plug structure according to a fifth preferred embodiment of the invention.

Portions of the barrier layer 124 shown in FIG. 8 can also be punched through. Please refer to FIGS. 14-17, which are schematic cross-sectional diagrams illustrating a method for forming a plug structure according to a fifth preferred embodiment of the invention, where like number numerals designate similar or the same parts, regions or elements. As shown in FIG. 14, a wafer 110, which has undergone the steps shown in FIGS. 5-8, is provided, and thus has a structure as same as the wafer 110 shown in FIG. 8.

Figure 15:
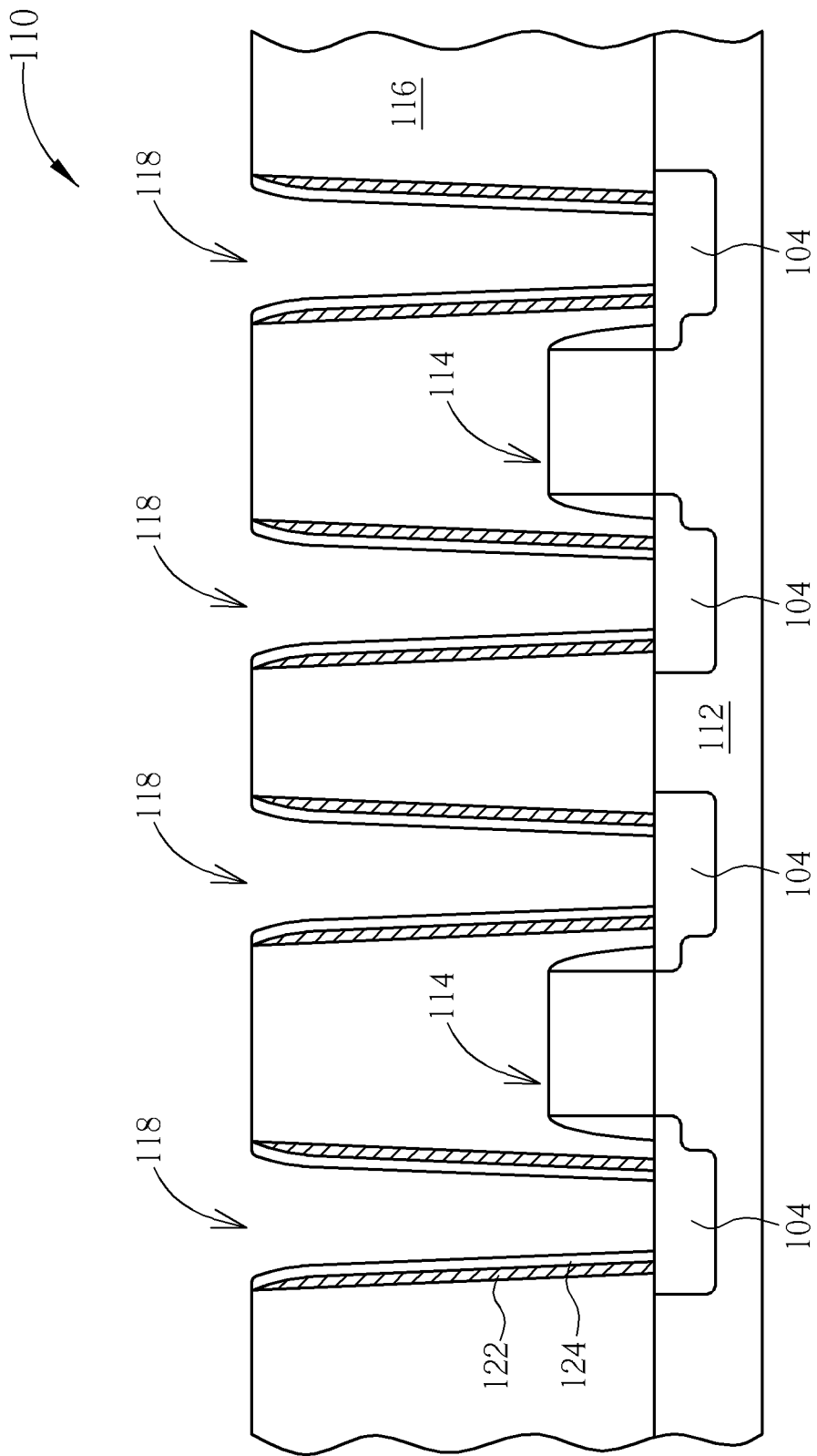

Subsequently, as shown in FIG. 15, portions of the barrier layer 124 disposed at the bottoms of the openings 118 is punched through until the MOS device 114 is exposed, where the glue layer 122 can be punched through by using an anisotropic etching process, such as a radio-frequency sputtering process. If the opening 118 has an overhang structure of the barrier layer 124 on each upper corner of the opening 118, the overhang structure can also be removed during this punching through process.

Figure 16:
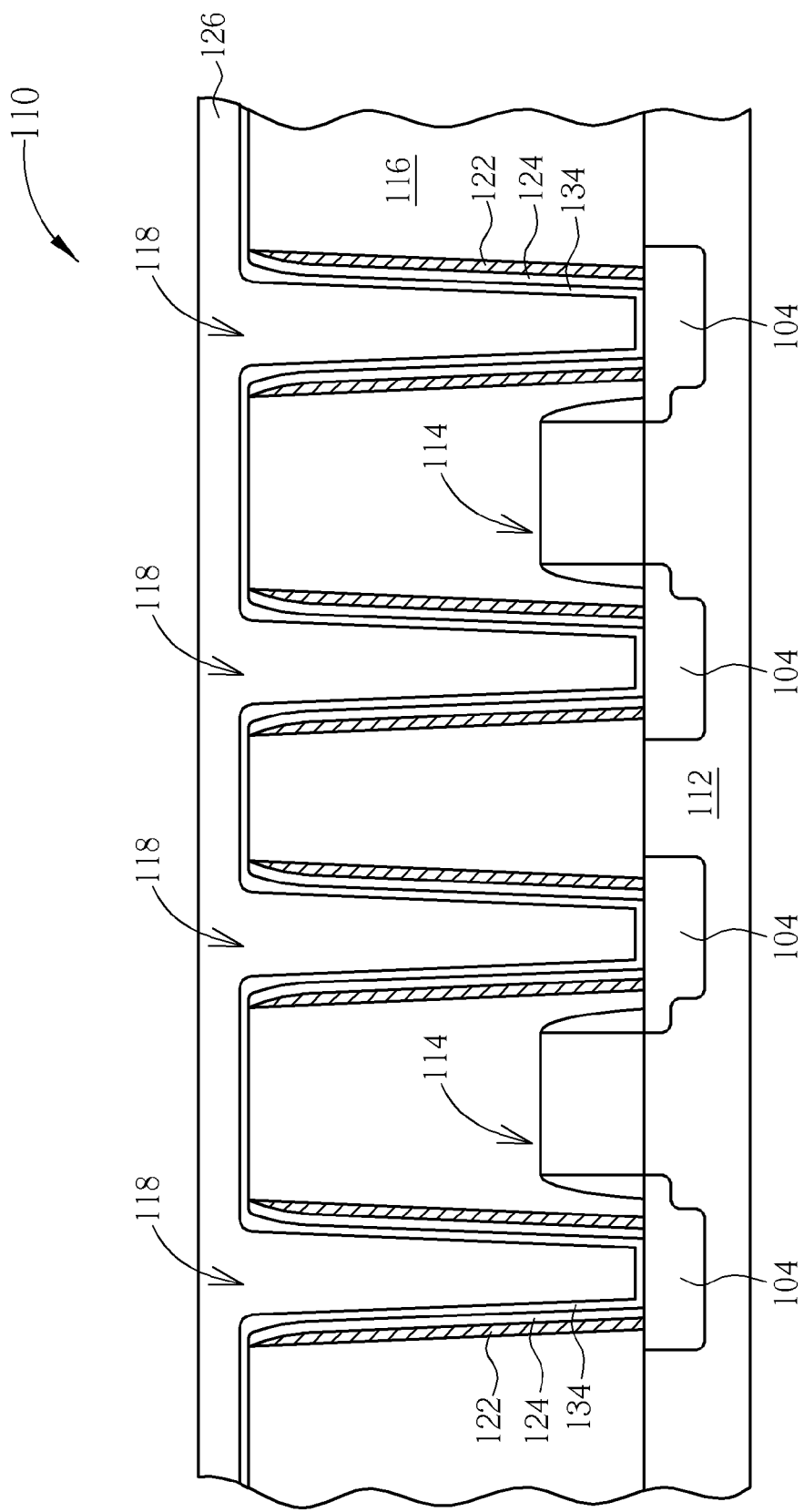
Figure 17:
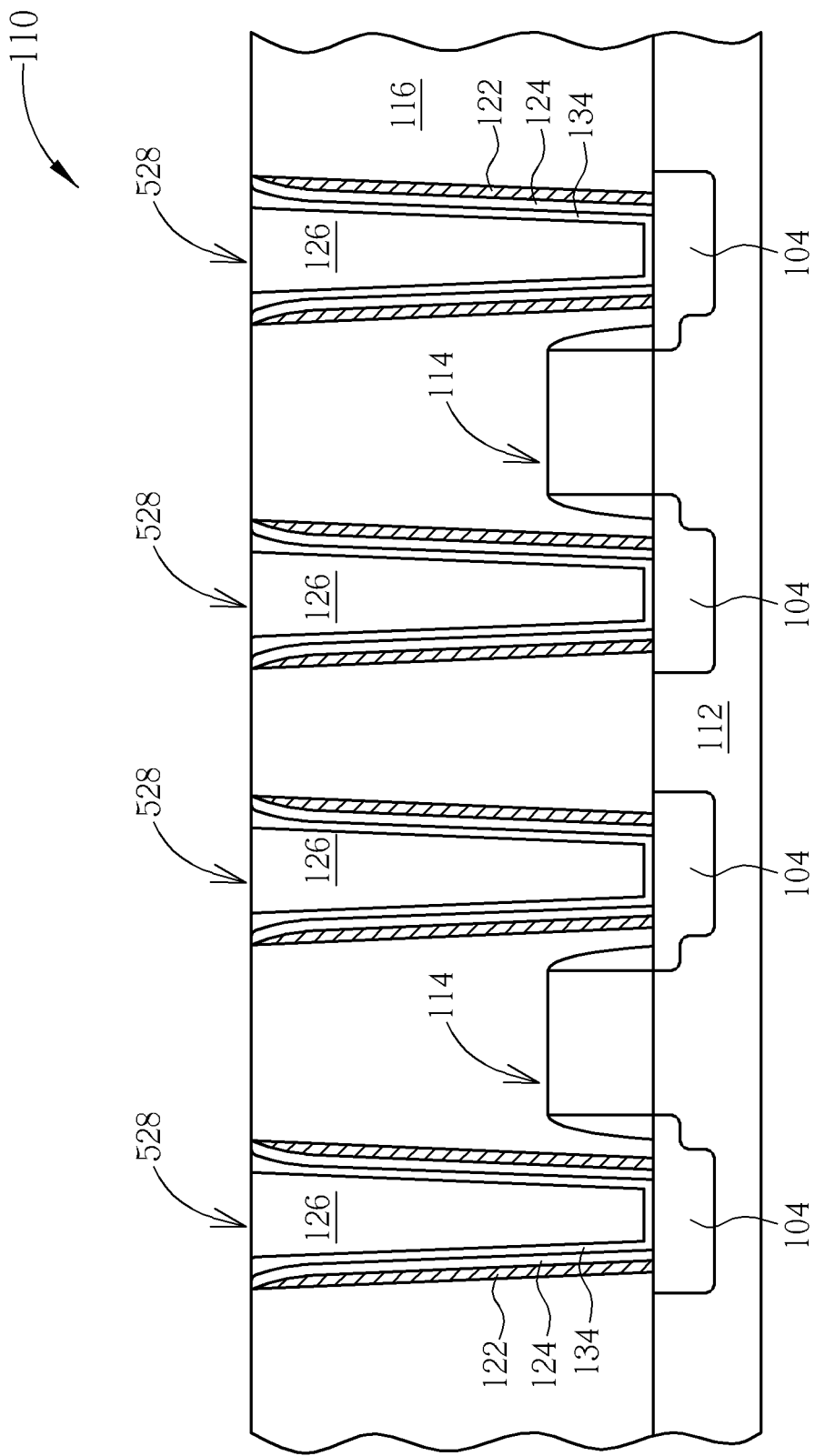

Afterward, as shown in FIG. 16, another barrier layer 134 is formed on the barrier layer 124, and a conductive material 126 is next formed to fill the opening 118. Next, as shown in FIG. 17, a planarization process is performed to remove excessive portions of the conductive material 126 and excessive portions of the barrier layer 134 so as to form a plurality of plug structures 528 in the dielectric layer 116.

Figure 18:
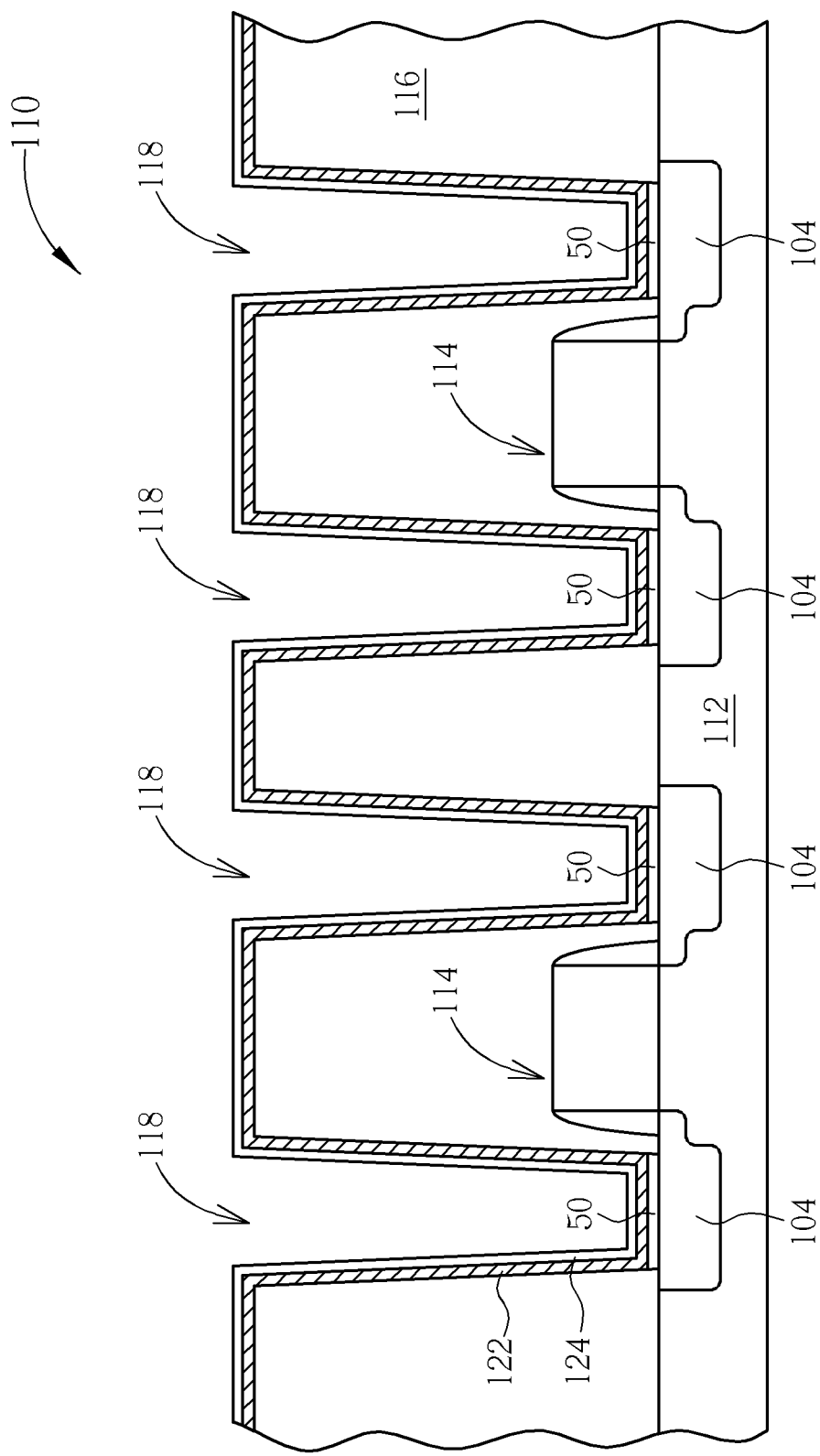
FIGS. 18-20 are schematic cross-sectional diagrams illustrating a method for forming a plug structure according to a sixth preferred embodiment of the invention.

Furthermore, portions of the barrier layer 124 can be punched through immediately after the glue layer 122 is punched through in other embodiments. Please refer to FIGS. 18-20, which are schematic cross-sectional diagrams illustrating a method for forming a plug structure according to a sixth preferred embodiment of the invention. As shown in FIG. 18, a wafer 110, which has undergone the steps shown in FIGS. 5-6, is provided, and a barrier layer 124 is next formed over the wafer 110. The glue layer 122 covers the oxides 50, and the barrier layer 124 can cover the surface of the glue layer 122.

Figure 19:
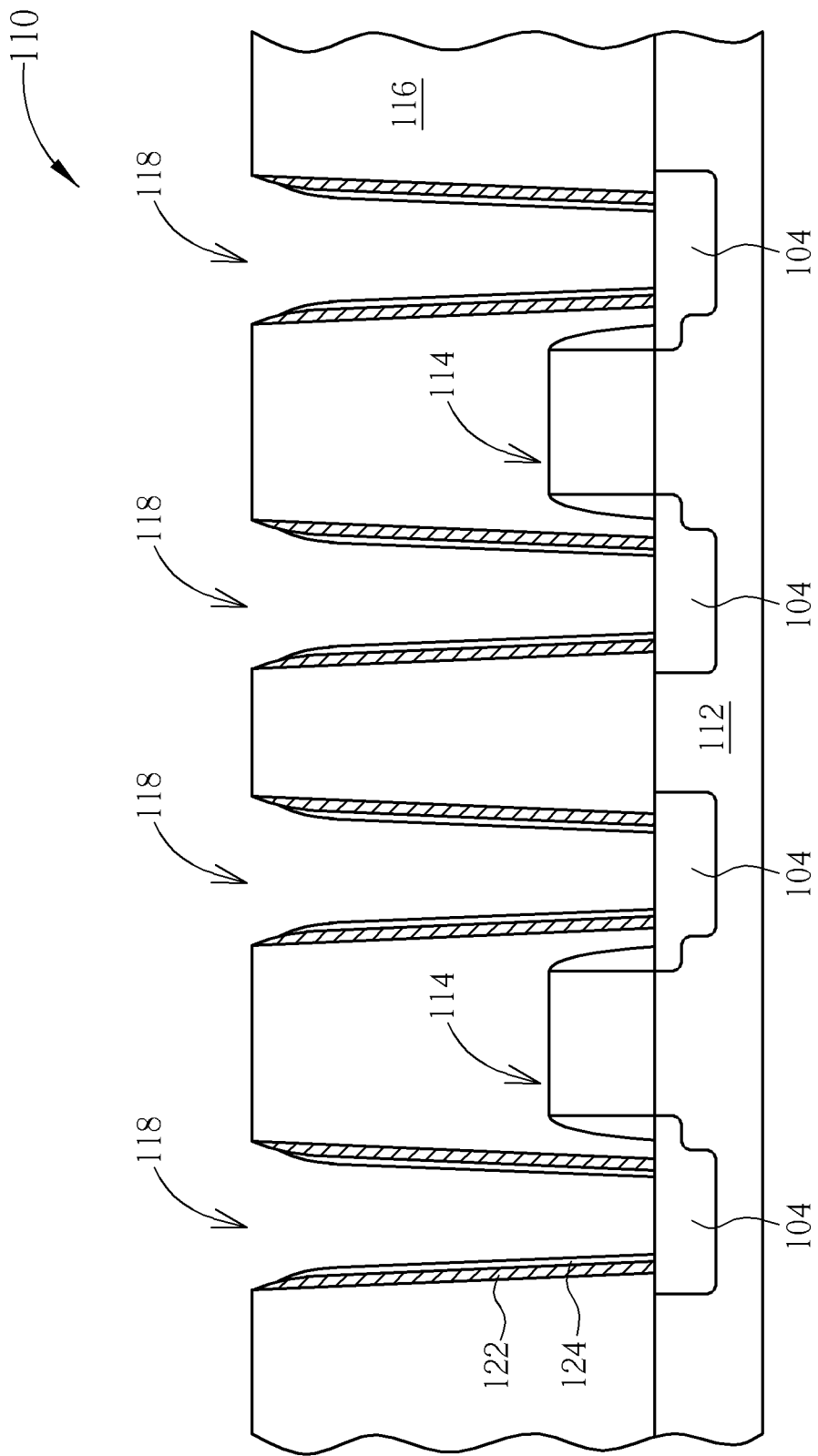

Subsequently, as shown in FIG. 19, portions of the barrier layer 124 and portions of the glue layer 122 disposed at the bottoms of the openings 118 are punched through until the MOS device 114 is exposed, where the barrier layer 124 and the glue layer 122 are punched through by using an anisotropic etching process. Afterward, as shown in FIG. 20, another barrier layer 134 is formed on the barrier layer 124, a conductive material 126 is next formed to fill the opening 118, and a planarization process is performed to remove excessive portions of the conductive material 126 and excessive portions of the barrier layer 134 so as to form a plurality of plug structures 628 in the dielectric layer 116.

Figure 20:
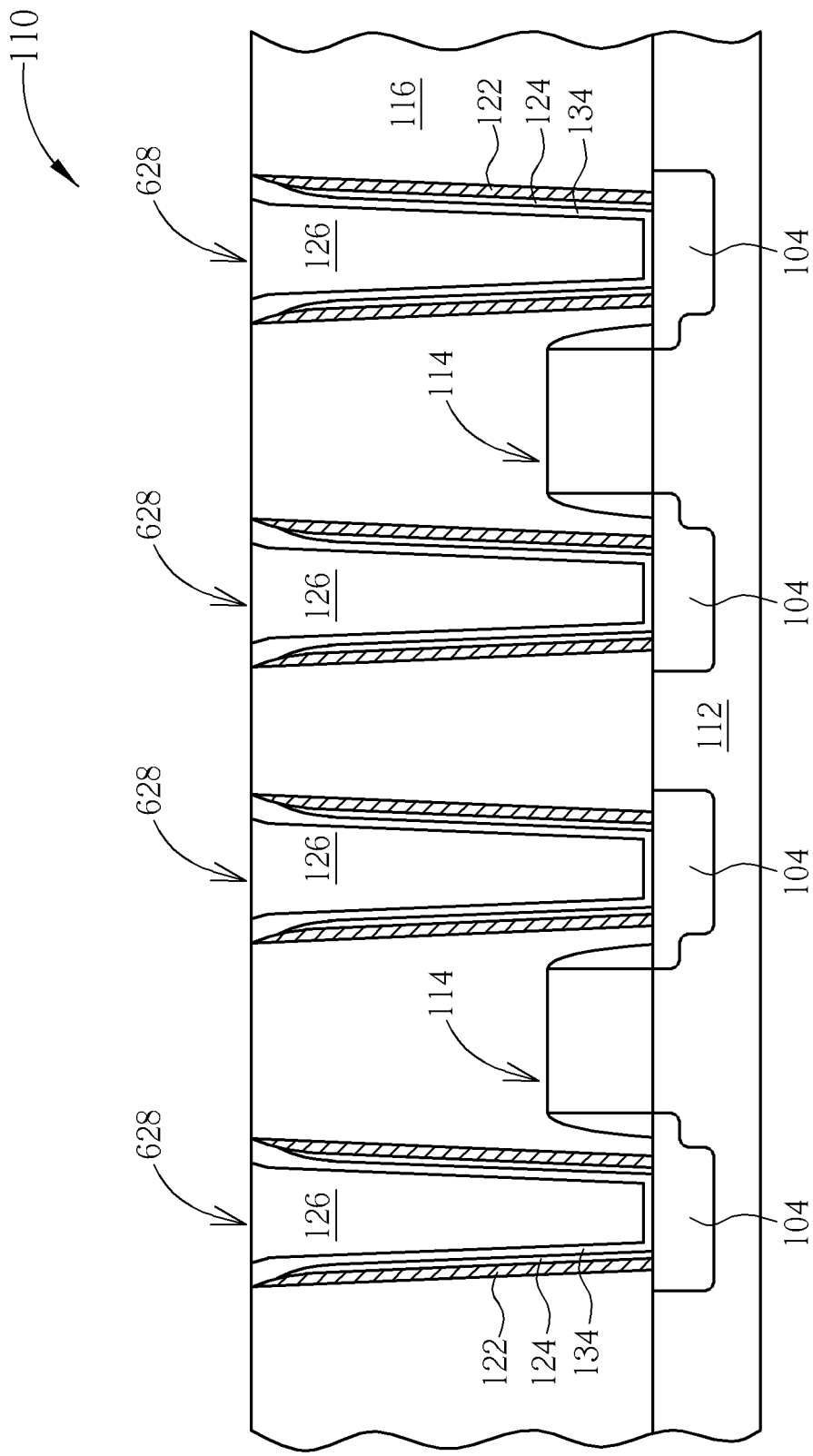
Figure 21:
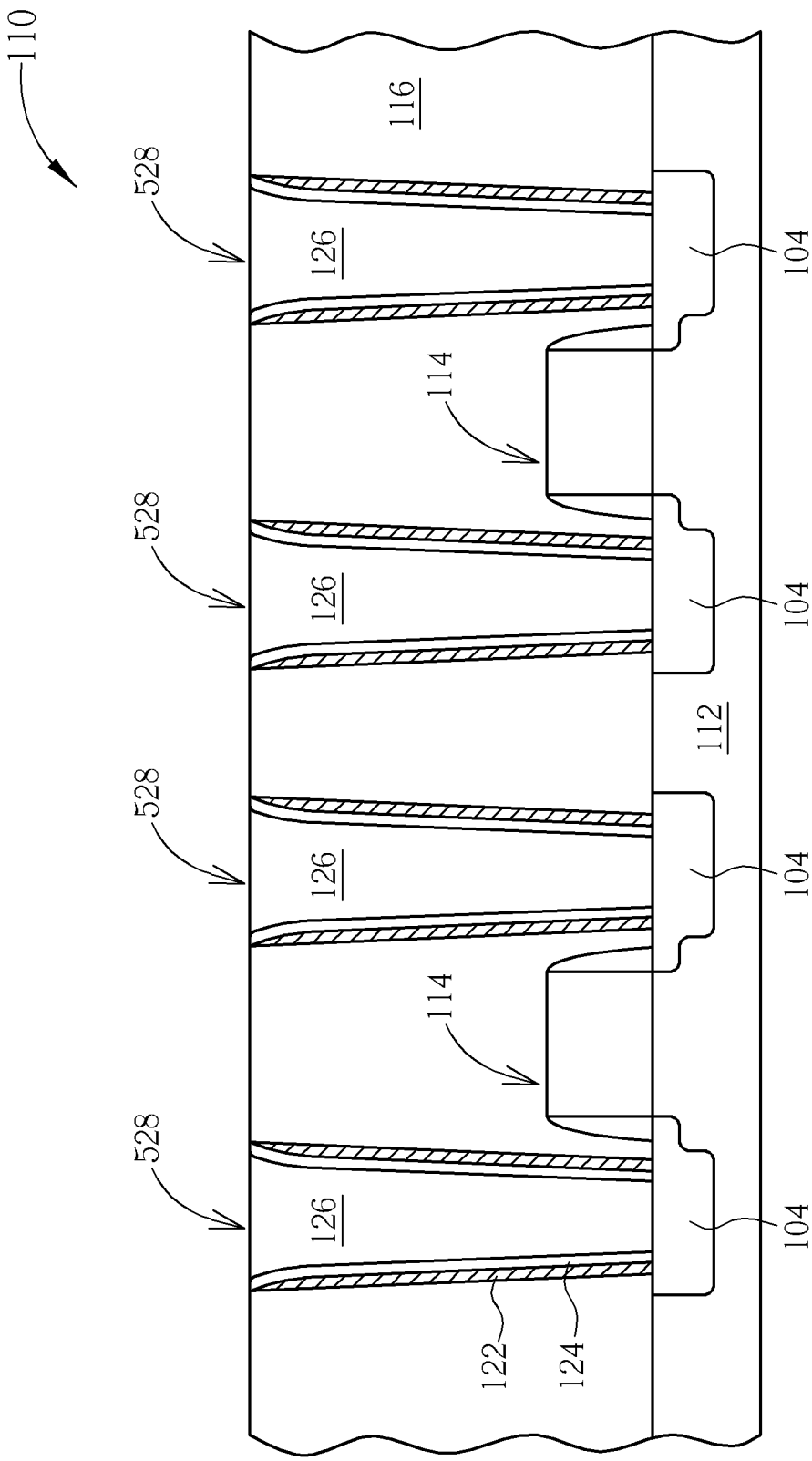
FIG. 21 is a schematic cross-sectional diagram illustrating a method for forming a plug structure according to a seventh preferred embodiment of the invention.
Figure 22:
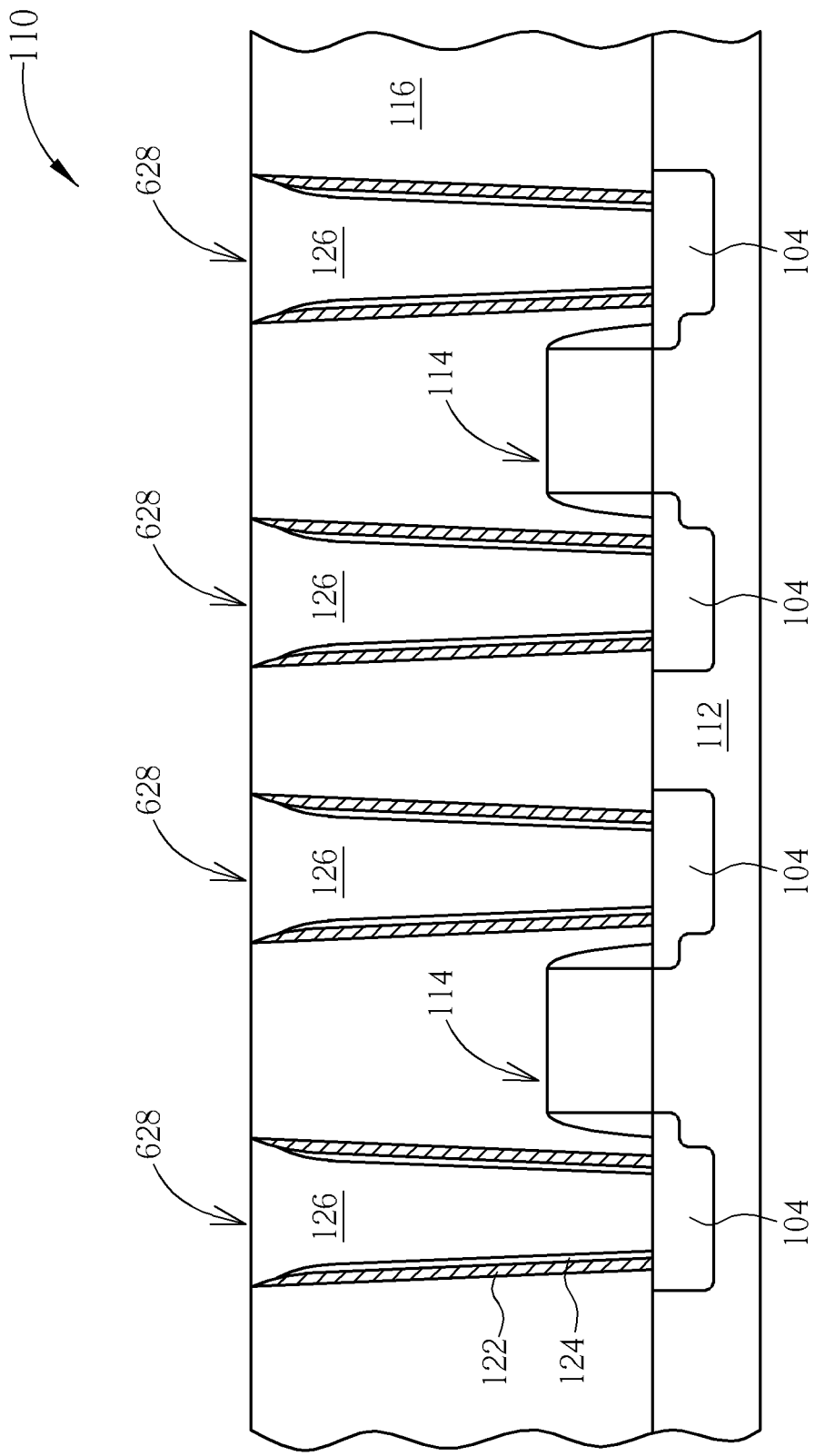
FIG. 22 is a schematic cross-sectional diagram illustrating a method for forming a plug structure according to an eighth preferred embodiment of the invention.

In other embodiments, the fabrication of the barrier layer 134 shown in FIG. 16 or FIG. 20 can also be eliminated. Please refer to FIG. 21 and FIG. 22. FIG. 21 is a schematic cross-sectional diagram illustrating a method for forming a plug structure according to a seventh preferred embodiment of the invention, and FIG. 22 is a schematic cross-sectional diagram illustrating a method for forming a plug structure according to an eighth preferred embodiment of the invention. As shown in FIG. 21, the fabrication of the barrier layer 134 can be eliminated, so the conductive material 126 covers the surface of the barrier layer 124, and contacts the MOS devices 114.

In the above-mentioned embodiments, tungsten process is taken as examples to specifically illustrate the cleaning method of the present invention. In other embodiments, the utilized materials, the patterns of the openings, or the devices positioned under the plugs can be change or modified. For example, the present invention can be applied to a copper process. Please refer to FIG. 23, which is a schematic cross-sectional diagram illustrating a method for forming a plug structure according to a ninth preferred embodiment of the invention, where like number numerals designate similar or the same parts, regions or elements. The main differences between the first preferred embodiment and the ninth preferred embodiment are the semiconductor devices positioned under the plugs and the materials of the glue layer, the barrier layer, and the conductive material.

Figure 23:
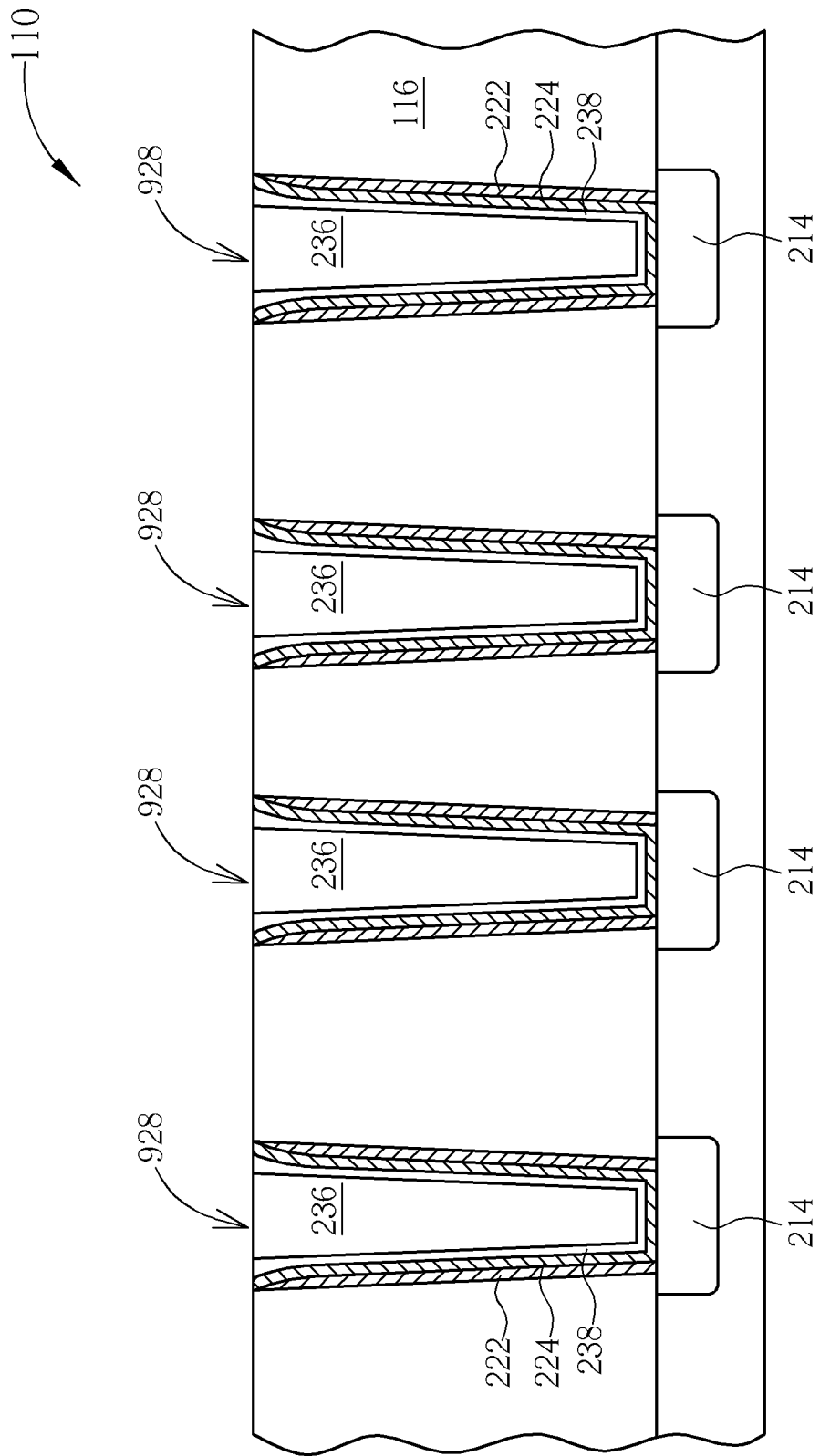
FIG. 23 is a schematic cross-sectional diagram illustrating a method for forming a plug structure according to a ninth preferred embodiment of the invention.

As shown in FIG. 23, the MOS devices 114 are replaced with metallic structures 214, the glue layer 122 is replaced with a glue layer 222, the barrier layer 124 is replaced with a barrier layer 224, and the conductive material contains copper. In this embodiment, the glue layer 222 includes a tantalum layer, and the barrier layer 224 can include a tantalum nitride layer in accordance with a copper process. The glue layer 222 and the barrier layer 224 can further prevent the diffusion of copper into the dielectric layer 116, which would short out the dielectric between neighboring via, or the diffusion of oxygen from the dielectric 116 into the metallic structures 214, which reduces the conductivity of the plug. In the case of copper process, the filling process typically includes a physical vapor deposition or sputtering deposition of the copper seed layer 238 followed by an electrochemical plating (ECP) of copper into the openings 118. Therefore, a plurality of plug structures 928 is formed, where each opening 118 is filled with a conductive structure. Each conductive structure includes a seed layer 238 covering a surface of the barrier layer, and a conductive material 236 filling the opening 118.

In addition, it should be noted that a pre-cleaning process could be further performed before the deposition of the glue layer 122 in the above-mentioned embodiments. For example, an Ar pre-cleaning process or an F-base pre-cleaning process can be performed to remove portions of the oxides. In order to protect the structures of the openings, the Ar pre-cleaning process must be soft and delicate, and should not be performed for a long time, in which most of the oxides remain in the openings.

Since the present invention utilizes a punch through process to remove the unwanted oxides disposed at the bottom of the opening, there are some advantages for the present invention as following listed. First, the method can contain no Ar cleaning process nor F-base cleaning process that deforms the structure of the opening. Therefore, the contact profile of the plug structure is improved, and a short circuit between two plugs, and a short circuit between the plug and the lower device can be avoided. Subsequently, the unwanted oxides are easily and effectively removed, so the contact resistance between the plug and the lower device can be decreased. Furthermore, the step coverage for the glue layer and the step coverage for the barrier layer are also improved due to the punch through process. As a result, the device performance can be increased as desired by an IC design.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a plug structure, the method comprising:
providing a substrate, the substrate comprising a MOS device with a source/drain region, a dielectric layer disposed on the MOS device, an opening defined in the dielectric layer wherein an oxide is disposed on a bottom of the opening, and a first glue layer disposed on the oxide and on a sidewall of the opening, wherein the first glue layer comprises metal materials;
punching through a portion of the first glue layer and the oxide disposed at the bottom of the opening by using an anisotropic etching process until the source/drain region is exposed;
forming a barrier layer over the substrate after the first glue layer is punched through; and
filling the opening with a conductive structure, wherein the barrier layer disposed at the bottom of the opening is remained when the conductive structure is filled into the opening.

2. The method for forming the plug structure of claim 1, further comprising a step of performing a pre-cleaning process before the first glue layer is formed.

3. The method for forming the plug structure of claim 2, wherein the pre-cleaning process comprises an argon (Ar) pre-cleaning process.

4. The method for forming the plug structure of claim 2, wherein the pre-cleaning process comprises an F-base pre-cleaning process.

5. The method for forming the plug structure of claim 1, wherein the anisotropic etching process comprises a radio-frequency (RF) sputtering process.

6. The method for forming the plug structure of claim 1, wherein the first glue layer comprises titanium (Ti), tantalum (Ta), or tungsten (W).

7. The method for forming the plug structure of claim 1, wherein the MOS device comprises a conducting region; the conducting region comprises nickel silicide (NiSi), and the conductive structure comprises tungsten.

8. The method for forming the plug structure of claim 1, wherein the opening of the dielectric layer is a contact hole.

* * * * *